(12) United States Patent
Masumi et al.

(10) Patent No.: US 12,707,165 B2
(45) Date of Patent: Aug. 11, 2026

(54) SOLID-STATE IMAGING DEVICE

(71) Applicant: SAMSUNG ELECTRONICS CO., LTD., Suwon-si (KR)

(72) Inventors: Shiono Masumi, Yokohama (JP); Oshima Itaru, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/889,697

(22) Filed: Sep. 19, 2024

(65) Prior Publication Data

US 2025/0097599 A1 Mar. 20, 2025

(30) Foreign Application Priority Data

Sep. 20, 2023 (JP) ................................ 2023-151929
Apr. 16, 2024 (KR) ........................ 10-2024-0050915

(51) Int. Cl.

| | |
|---|---|
| ***H04N 25/76*** | (2023.01) |
| ***H04N 25/707*** | (2023.01) |
| ***H04N 25/77*** | (2023.01) |
| ***H10F 39/00*** | (2025.01) |

(52) U.S. Cl.

CPC ........... *H04N 25/76* (2023.01); *H04N 25/707* (2023.01); *H04N 25/77* (2023.01); *H10F 39/811* (2025.01)

(58) Field of Classification Search

CPC ...... H04N 25/76; H04N 25/707; H04N 25/77; H04N 25/773; H10F 39/811; H10F 39/803; H10F 39/809

See application file for complete search history.

(56) References Cited

U.S. PATENT DOCUMENTS

| | | | | |
|---|---|---|---|---|
| 10,720,465 B2 | 7/2020 | Matsumoto et al. | | |
| 10,998,367 B2 | 5/2021 | Matsumoto | | |
| 11,056,463 B2 | 7/2021 | Takahashi et al. | | |
| 11,297,258 B2 | 4/2022 | Goma et al. | | |
| 11,323,645 B2 | 5/2022 | Kawasaki | | |
| 11,336,860 B2 | 5/2022 | Yonemoto | | |
| 11,380,722 B2 | 7/2022 | Seo et al. | | |
| 11,846,542 B2 | 12/2023 | Yamazaki et al. | | |
| 2003/0169841 A1* | 9/2003 | van der Valk | H03K 23/665 | 377/115 |
| 2012/0205522 A1* | 8/2012 | Richardson | H04N 25/773 | 250/214.1 |
| 2013/0314573 A1* | 11/2013 | Tsukimura | H04N 25/616 | 348/302 |

(Continued)

FOREIGN PATENT DOCUMENTS

| | | |
|---|---|---|
| JP | 2018-530250 A | 10/2018 |
| JP | 2020-53782 A | 4/2020 |

(Continued)

*Primary Examiner* — Timothy J Henn
(74) *Attorney, Agent, or Firm* — Sughrue Mion, PLLC

(57) ABSTRACT

A solid-state imaging device with increased integration is provided. A pixel of the solid-state imaging device includes a photoelectric converter and a counter that counts a pulse signal output based on the amount of light incident on the photoelectric converter, wherein the counter may be divided into a lower bit group and an upper bit group, a first integrated circuit is provided between the lower bit group and the upper bit group, and the first integrated circuit may connect the lower bit group and the upper bit group of a plurality of pixels to each other.

20 Claims, 20 Drawing Sheets

(56) References Cited

U.S. PATENT DOCUMENTS

| | | | | |
|---|---|---|---|---|
| 2016/0014359 | A1* | 1/2016 | Ota | H04N 25/134 348/222.1 |
| 2019/0373200 | A1* | 12/2019 | Yeh | H03M 1/007 |
| 2019/0394417 | A1* | 12/2019 | Hisamatsu | H03M 1/285 |
| 2020/0204749 | A1* | 6/2020 | Mori | H10F 39/812 |
| 2020/0252563 | A1* | 8/2020 | Yasuda | H04N 25/704 |
| 2021/0135682 | A1* | 5/2021 | Nakano | H04N 25/616 |
| 2021/0270939 | A1* | 9/2021 | Sakurano | G01S 17/14 |
| 2022/0021826 | A1 | 1/2022 | Ejiri | |
| 2022/0078362 | A1* | 3/2022 | Jung | H04N 25/77 |
| 2022/0128660 | A1 | 4/2022 | Suzuki | |
| 2022/0190011 | A1 | 6/2022 | Yamazaki | |
| 2023/0047180 | A1 | 2/2023 | Kodama | |
| 2023/0224609 | A1* | 7/2023 | Hikosaka | H04N 25/583 348/294 |
| 2023/0300494 | A1 | 9/2023 | Hizu | |
| 2023/0417920 | A1 | 12/2023 | Moriyama et al. | |
| 2024/0027585 | A1 | 1/2024 | Morikawa et al. | |
| 2024/0048872 | A1* | 2/2024 | Nakajima | G01S 7/4865 |

FOREIGN PATENT DOCUMENTS

| | | | |
|---|---|---|---|
| JP | 2020-65072 | A | 4/2020 |
| JP | 2020-96225 | A | 6/2020 |
| JP | 2020-129796 | A | 8/2020 |
| JP | 2020-134171 | A | 8/2020 |
| JP | 6747299 | B2 | 8/2020 |
| JP | 6748505 | B2 | 9/2020 |
| JP | 2021-114742 | A | 8/2021 |
| JP | 2021-136590 | A | 9/2021 |
| JP | 2021-197596 | A | 12/2021 |
| JP | 2022-046686 | A | 3/2022 |
| JP | 2022-054553 | A | 4/2022 |
| JP | 2022-063415 | A | 4/2022 |
| JP | 2022-073105 | A | 5/2022 |
| JP | 2022-079776 | A | 5/2022 |
| JP | 2022-092345 | A | 6/2022 |
| WO | 2020/045122 | A1 | 3/2020 |
| WO | 2021/153254 | A1 | 8/2021 |

* cited by examiner

Figure 8:
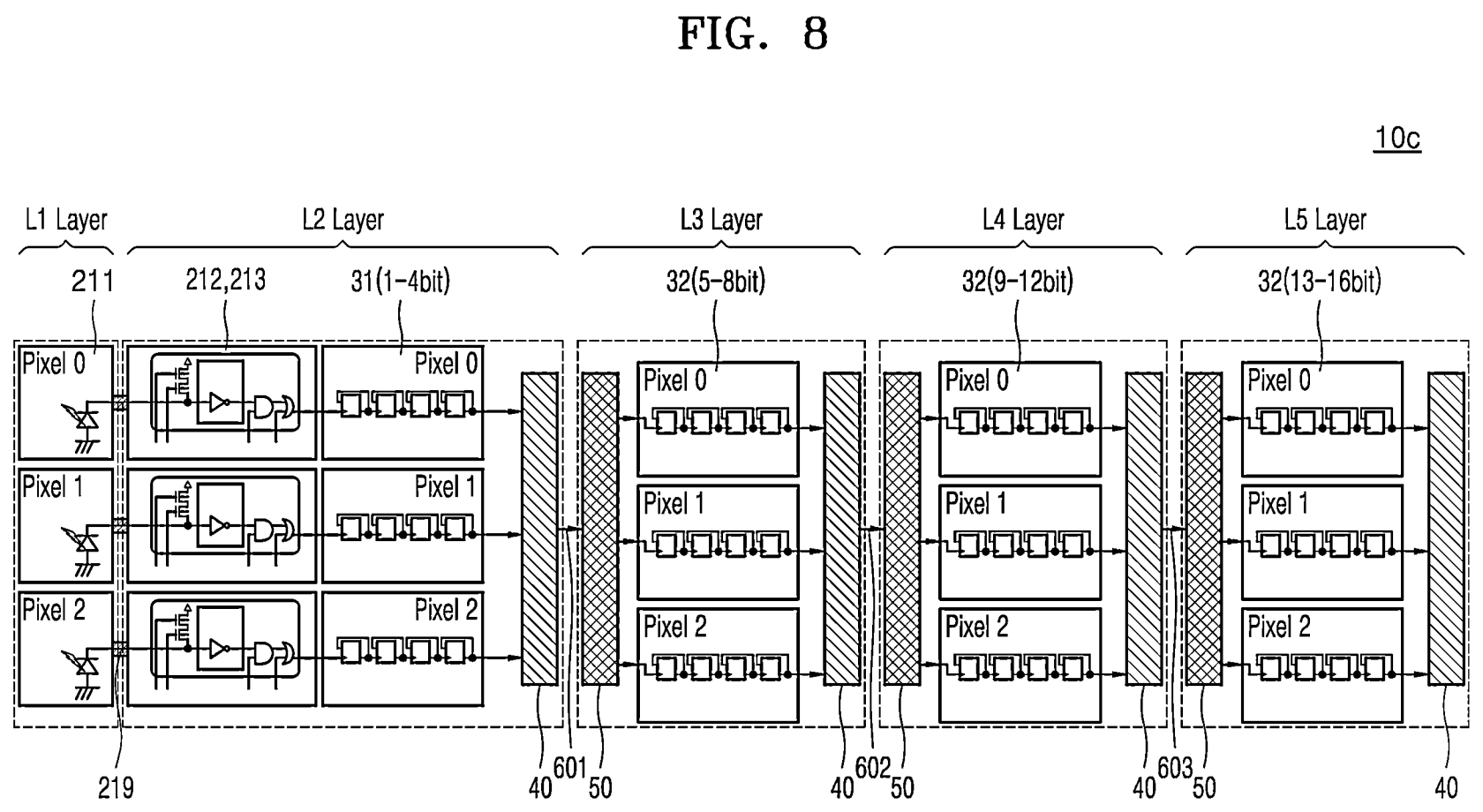

L1 Layer
211
Pixel 0
Pixel 1
Pixel 2
219

L2 Layer
212,213
31(1–4bit)
Pixel 0
Pixel 1
Pixel 2
40
601

L3 Layer
32(5–8bit)
Pixel 0
Pixel 1
Pixel 2
50
40
602

L4 Layer
32(9–12bit)
Pixel 0
Pixel 1
Pixel 2
50
40
603

L5 Layer
32(13–16bit)
Pixel 0
Pixel 1
Pixel 2
50
40

10e
Binning Mode
L1 Layer
L2 Layer
L3 Layer
L4 Layer
Pixel 0
Pixel 1
Pixel 2
Pixel 3
Pixel 0–3
not use
211
212
213
219
31
32
40
50
60

10f
Binning Mode
211
Pixel 0
Pixel 1
Pixel 2
Pixel 3
212
31
40
L1 Layer
219
L2 Layer
213
50
32
Pixel 0-3
60
L3 Layer
Pixel 0-3
60
L4 Layer
50

L1 Layer
L2 Layer
L3 Layer
L4 Layer
Pixel 0
Pixel 1
Pixel 2
Pixel 3
SRAM
211
212
213
219
31
40
50
60
321

SOLID-STATE IMAGING DEVICE

CROSS-REFERENCE TO RELATED APPLICATION

This application is based on and claims priority from Japanese Patent Application No. 2023-151929, filed on Sep. 20, 2023, in the Japanese Patent Office and Korean Patent Application No. 10-2024-0050915, filed on Apr. 16, 2024, in the Korean Intellectual Property Office, the disclosures of which are incorporated herein in their entireties by reference.

BACKGROUND

1. Field

The disclosure relates to a solid-state imaging device.

2. Description of Related Art

A solid-state imaging device receives light incident from a subject, converts the received light into photoelectricity, and generates an electrical signal. The solid-state imaging device may be an image sensor. Recently, imaging technology has been used to convert a photoelectrically converted analog signal into an analog/digital (A/D) converted signal within an image sensor to output the A/D converted signal as digital data. For example, Patent Document 1 (JP 2018-019276) describes a 1-bit A/D conversion circuit provided for each pixel, and counting a pulse signal output based on an amount of light incident on a photoelectric converter with a counter. Moreover, the Patent Document 1 describes that the amount of light that may be input is not limited by the storage capacity of the photoelectric converter, and the dynamic range of the image sensor may be improved.

Additionally, a single-photon avalanche diode (SPAD) is being developed as a new technology, which is described, for example, in Patent Document 2 (JP 2023-066374). In the SPAD, a number of photons incident during a certain period of time is output as a count, so the output of the photoelectric conversion element itself may be treated as a digital signal.

In addition, in the image sensor of Patent Document 1, when a 16-bit counter circuit is arranged in a flat array for each pixel, the area of the counter circuit may be large. As such, there is a problem in that the pixel may not be made small and high resolution may not be secured. To solve this problem, a technology has been proposed to achieve higher density by arranging the photoelectric converter of the pixel and the counter circuit in different layers and by arranging the counter circuits in multiple layers, in a three-dimensional integrated circuit. For example, in order to achieve higher density by reducing the number of through electrodes for transmitting counter signals between multiple layers, Patent Document 1 describes that transmission of counter signals between counter circuits arranged in multiple layers is configured to use common signal lines and output pads.

Moreover, Patent Document 1 describes that counters using the common signal line and output pad are sequentially selected by a selection switch including a horizontal scanning line and a vertical signal line connected to the counters of the counter array. Therefore, when achieving high resolution by increasing the number of pixels, switching to a higher speed using a selection switch is necessary to maintain the same frame rate (image capturing cycle), which limits the high resolution. In addition, there is a problem that charging and discharging power in the shared wiring increases, making it difficult to save power.

SUMMARY

One or more aspects of the disclosure provide a solid-state imaging device with increased integration.

According to an aspect of the disclosure, there is provided a solid-state imaging device including: a plurality of pixels, each of the plurality of pixels including: a photoelectric converter; and a counter configured to count a pulse signal output based on an amount of light incident on the photoelectric converter, the counter including a first bit group counter and a second bit group counter; and a first integrated circuit provided between the first bit group counter and the second bit group counter, and configured to connect the first bit group counter to the second bit group counter.

According to another aspect of the disclosure, there is provided a solid-state imaging device configured by stacking a plurality of layers, the solid-state imaging device including: a plurality of pixels, each of the plurality of pixels including: a photoelectric converter; and a signal processing unit including: a counter configured to count a pulse signal output based on an amount of light incident on the photoelectric converter, the counter including a first bit group counter and a second bit group counter formed in different layers among the plurality of layers.

According to another aspect of the disclosure, there is provided a solid-state imaging device including a pixel unit including a plurality of vertically and horizontally adjacent pixels, the solid-state imaging device including: a counter configured to count pulse signals output based on an amount of light incident on each of the plurality of pixels, the counter including a first bit group counter and a second bit group counter, wherein the second bit group counter corresponding to the plurality of pixels is arranged in at least two layers, and wherein the first bit group counter corresponding to the plurality of pixels included in the pixel unit is arranged as one layer different from the layers in which the second bit group counter is arranged.

BRIEF DESCRIPTION OF DRAWINGS

Embodiments of the disclosure will be more clearly understood from the following detailed description taken in conjunction with the accompanying drawings in which:

FIG. 4 is a schematic configuration diagram showing an arrangement of each layer and interlayer connections;

FIG. 8 is a schematic configuration diagram showing a circuit of each layer in the embodiment;

FIG. 18 is a schematic configuration diagram showing a circuit of each layer and interlayer connections of a solid-state imaging device in an embodiment.

DETAILED DESCRIPTION

Figure 1:
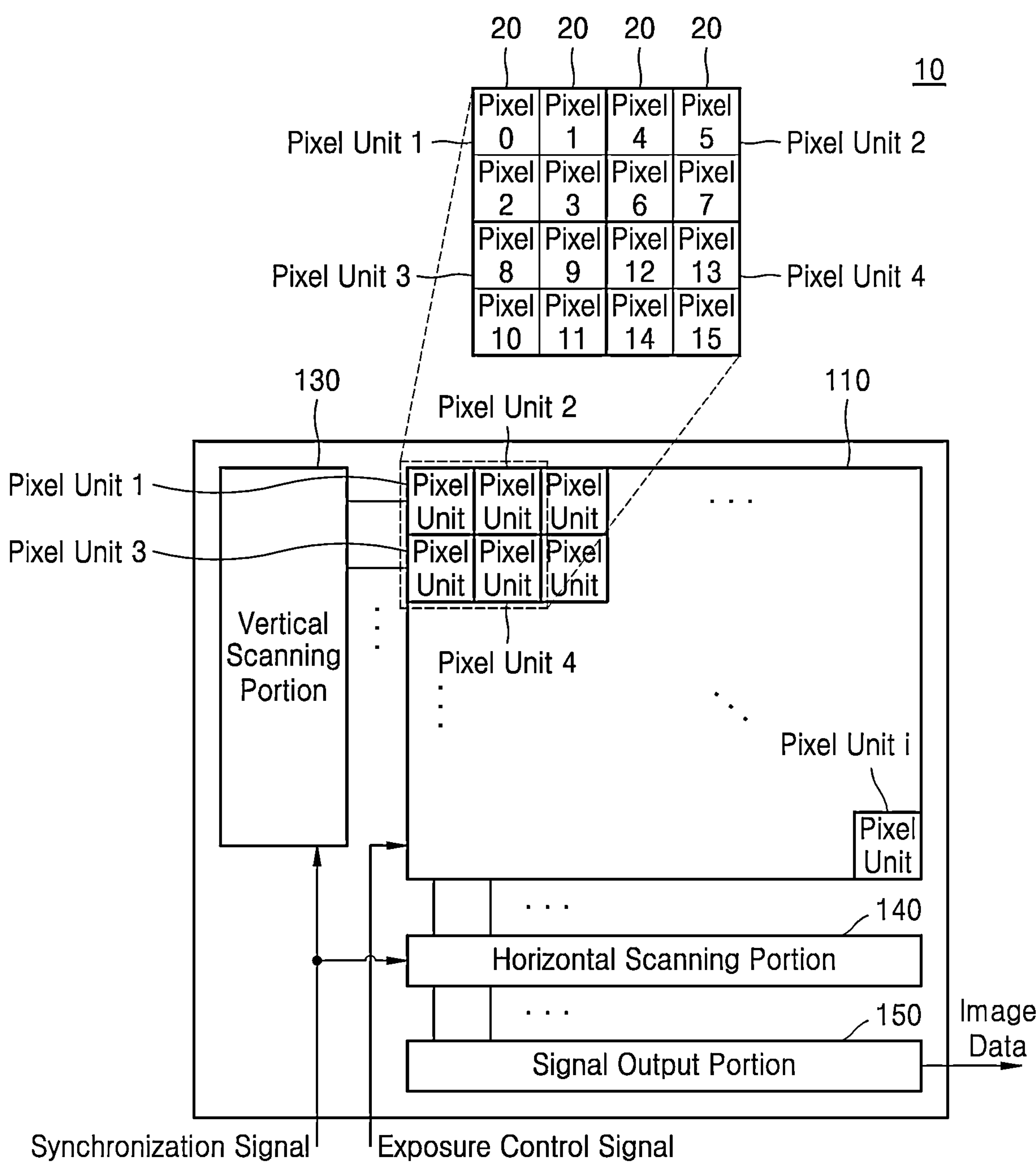
FIG. 1 is a block diagram showing the schematic configuration of a solid-state imaging device according to an embodiment.

Hereinafter, embodiments of the disclosure are described with reference to the attached drawings. These embodiments are example embodiments. However, the disclosure is not limited to the described embodiments. Additionally, in the description of the drawings, same elements are given the same reference numerals, and descriptions already given are omitted. Additionally, the dimensional ratios in the drawings may be exaggerated for convenience of explanation and may differ from the actual ratios. Hereinafter, a first direction in a plane perpendicular to the incident direction of light of the solid-state imaging device is referred to as a horizontal direction, row direction, or X direction, and a second direction perpendicular to the first direction is referred to as a vertical direction, column direction, or Y direction. In addition, when viewed from a plane (e.g., FIG. 3A, etc.), the arrangement position of circuit elements in the XY plane is also referred to an XY coordinate position.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms “comprising”, “having” and “including” are to be construed as open-ended terms unless otherwise noted.

The words/phrases “exemplary”, “example”, “illustration”, “in an instance”, “and the like”, “and so on”, “etc.”, “etcetera”, “e.g.,”, “i.e.,” are merely used herein to mean “serving as an example, instance, or illustration.” Any embodiment or implementation of the present subject matter described herein using the words/phrases “exemplary”, “example”, “illustration”, “in an instance”, “and the like”, “and so on”, “etc.”, “etcetera”, “e.g.,”, “i.e.,” is not necessarily to be construed as preferred or advantageous over other embodiments.

Embodiments herein may be described and illustrated in terms of blocks which carry out a described function or functions. These blocks, which may be referred to herein as managers, units, modules, hardware components, terms ending in “~er” or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

It should be noted that elements in the drawings are illustrated for the purposes of this description and ease of understanding and may not have necessarily been drawn to scale. For example, the flowcharts/sequence diagrams illustrate the method in terms of the operations required for understanding of aspects of the embodiments of the disclosure. Furthermore, in terms of the construction of the device, one or more components of the device may have been represented in the drawings by conventional symbols, and the drawings may show only those specific details that are pertinent to understanding the present embodiments so as not to obscure the drawings with details that will be readily apparent to those of ordinary skill in the art having the benefit of the description herein. Furthermore, in terms of the system, one or more components/modules which include the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the embodiments presented herein are not limited by the accompanying drawings. As such, the disclosure should be construed to extend to any modifications, equivalents, and substitutes in addition to those which are particularly set out in the accompanying drawings and the corresponding description. Usage of words such as first, second, third etc., to describe components/elements/operations is for the purposes of this description and should not be construed as sequential ordering/placement/occurrence unless specified otherwise.

Figure 2:
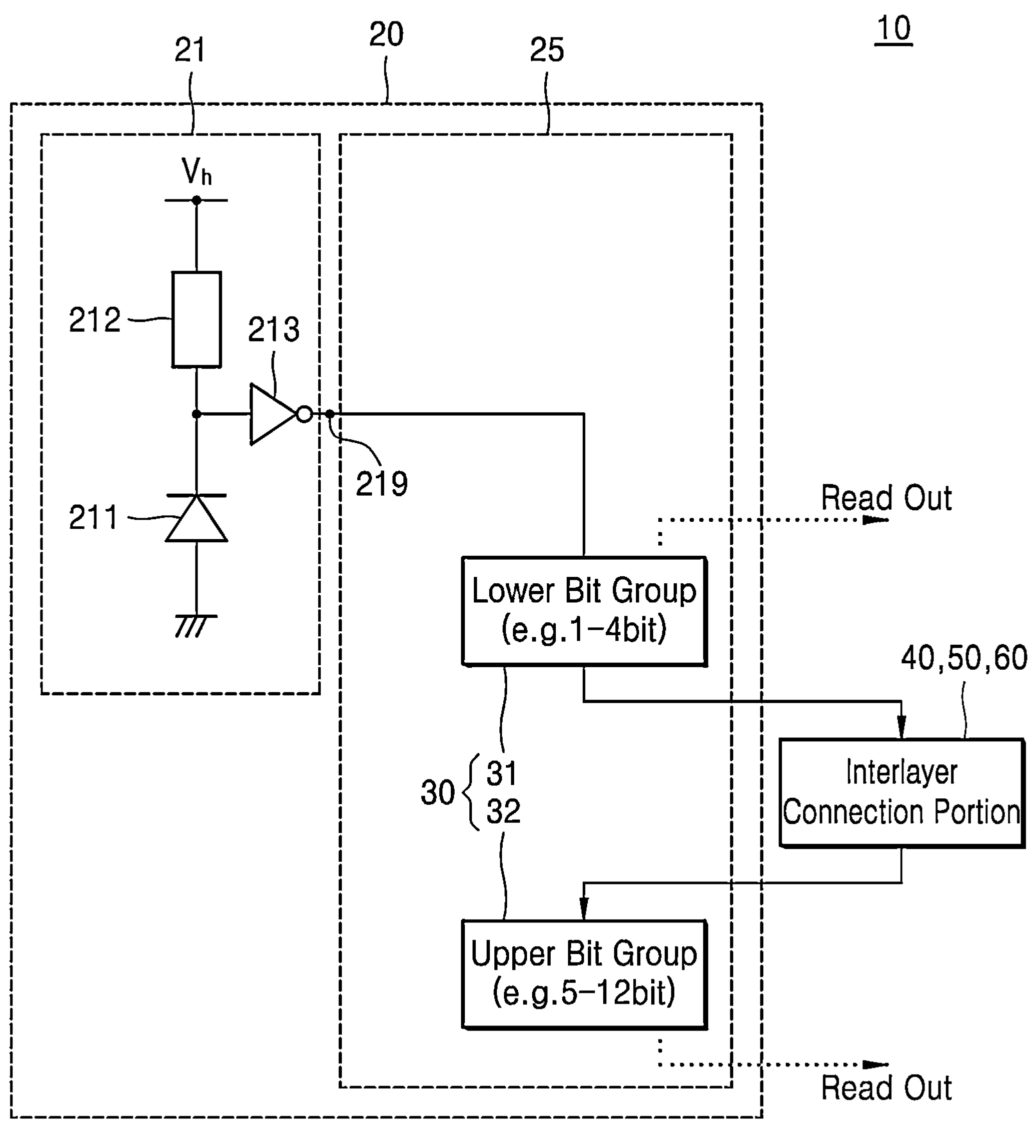
FIG. 2 is a block diagram showing an example of the configuration of a pixel in a solid-state imaging device.

Hereinafter, a solid-state imaging device 10 according to an embodiment is described with reference to FIGS. 1 to 9. FIG. 1 is a block diagram showing a schematic configuration of the solid-state imaging device 10 according to an embodiment. FIG. 2 is a block diagram showing an example configuration of the pixel 20 of the solid-state imaging device 10 according to an embodiment.

Figure 3A:
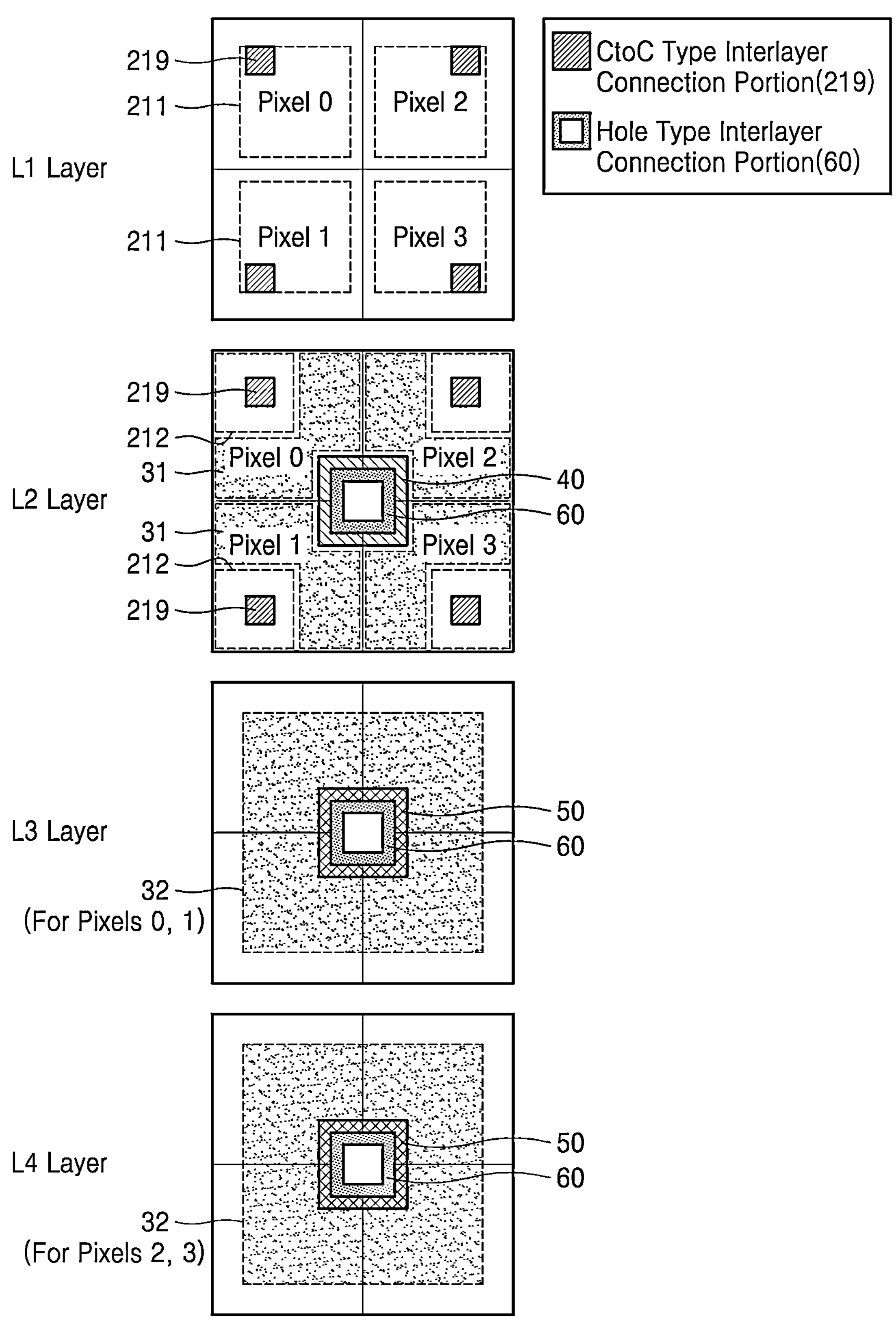
FIG. 3A is a top view showing the stacked structure of a solid-state imaging device.

Referring to FIG. 1, the solid-state imaging device 10 may include a pixel array 110, a vertical scanning portion 130, a horizontal scanning portion 140, and a signal output portion 150. The pixel array 110 may include a plurality of pixels 20 arranged side by side in an array shape in the row and column directions (M×N). Here, M and N are integers. The pixel array 110 may include all pixels 20 of the solid-state imaging device 10. For example, the pixel array 110 may include millions of pixels or more. A pixel unit described below may include several to dozens of pixels 20. However, the disclosure is not limited thereto, and as such, the number of pixels 20 in a pixel unit may vary. For example, FIG. 3A illustrates a pixel unit including four pixels.

Referring to FIG. 1, a synchronization signal may be input to the vertical scanning portion 130 and the horizontal scanning portion 140, respectively, and an exposure control signal may be input to the pixel array 110.

For example, the vertical scanning portion 130 may select pixels in rows (e.g., in the Y direction), and the horizontal scanning portion 140 may select pixels in the columns (e.g., in the X direction), such that each pixel is selected in order by an X-Y address method, and the pixel signal (count signal) of the selected pixel is output to the signal output portion 150 through the signal line. In the signal output portion 150, pixel signals of each pixel output to the signal line may be collected and output to an external recording unit or signal processing unit as image data. However, the disclosure is not limited to an X-Y address method, and as such, the selection of the pixels in the pixel array may be performed using a different method.

Referring to FIG. 2, each pixel 20 may include a photoelectric converter 21 and a signal processing unit 25. In addition, each pixel 20 may be connected to interlayer connection portions 40, 50, and 60 of the solid-state imaging device 10. The interlayer connection portions 40, 50, and 60 of the solid-state imaging device 10 are described below with reference to FIGS. 3A to 3C.

The photoelectric converter 21 may include a photodiode 211, a quench element 212, and a waveform shaping element 213. The photodiode 211 may be referred to as a photoelectric conversion element. The photoelectric converter 21 may output a pulse signal based on the amount of incident light. For example, the photoelectric converter 21 may output a pulse signal based on an amount of incident light incident on the photodiode 211. The photoelectric converter 21 may include a single-photon avalanche diode (SPAD). For example, the photodiode 211 may include a SPAD that counts the number of photons incident on the entrance surface. The SPAD may be a next-generation semiconductor optical device with extremely high efficiency as the SPAD detects single photons due to the extremely high gain characteristics of the device. In the SPAD, an impact ionization phenomenon occurs. The impact ionization phenomenon refers to a phenomenon in which when a voltage higher than the breakdown voltage of the device is applied, free electrons (carriers) are accelerated by a very large electric field, causing the accelerated free electrons to strongly collide with atoms, and the strong collision causes the electrons bound to the atom to be released, thereby rapidly increasing the number of free electrons. This is called avalanche multiplication, and due to this effect, the number of free electrons generated by photons irradiated to the image sensor from the outside increases significantly.

The quench element 212 may include a cathode resistance element of the photodiode 211. For example, a first end of the quench element 212 may be connected to the cathode of the photodiode 211, and a second end of the quench element 212 may be connected to a voltage Vh higher than the ground voltage Vl connected to the anode of the photodiode 211. Whenever a photocurrent is output from the photodiode 211 due to the incident photon, the photocurrent flows to the quench element 212 and the cathode potential of the photodiode 211 drops to a value lower than the voltage Vh. As such, the quench element is configured to stop the avalanche breakdown process by stopping the rapid flow of current in the photodiode. However, the disclosure is not limited thereto, and as such, according to another embodiment, the quench element 212 may include, but is not limited to, a MOS transistor.

The waveform shaping element 213 may include an inverter and may perform a pulse generation operation that converts the output of the photodiode 211 into a pulse signal. In an example case in which the voltage of the cathode of the photodiode 211 decreases due to the photocurrent and the output signal (also referred to as optical signal output) input to the waveform shaping element 213 reaches the inversion threshold voltage, the output of the waveform shaping element 213 is inverted and a high pulse signal is output.

However, the disclosure is not limited thereto, and as such, according to another embodiment, the photoelectric conversion element used in the photoelectric converter 21 may be different than the SPAD. For example, the photoelectric conversion element used in the photoelectric converter 21 may be a normal (or a regular) photodiode. In an example case in which the photoelectric conversion element used in the photoelectric converter 21 is a normal photodiode, electrons generated by photoelectric conversion are accumulated in the photodiode 211, which lowers the voltage at the cathode of the photodiode 211, and thus a pulse signal is output from the waveform shaping element 213. FIG. 2 shows an example in which the quench element 212 and the waveform shaping element 213 are connected to the cathode of the photodiode 211. However, the disclosure is not limited thereto, and as such, according to another embodiment, the anode of the photodiode 211 may also be configured to be connected to the quench element 212 and the waveform shaping element 213.

The signal processing unit 25 may include a counter 30. The solid-state imaging device 10 may be provided in a stacked structure, and the signal processing unit 25 may be arranged over multiple layers.

The counter 30 of one pixel 20 may include a few bits to several tens of bits, and may be divided into a plurality of counter portions at a number of digits. The number of digits may be predetermined. According to an embodiment, the counter 30 may be 12 bits in total, and the counter may be divided into a first counter for a first group of bits and a second counter for a second group of bits. For example, the first counter (hereinafter referred to as lower bit group counter 31) may be for a lower bit group counter 31 of 1 to 4 bits and the second counter (hereinafter referred to as upper bit group counter 32) may be for an upper bit group counter 32 of 5 to 12 bits. However, the disclosure is not limited thereto, and as such, according to another embodiment, the counter 30 may be divided into more than two counters. The lower bit group counter 31 may be arranged on the same layer as other components 212 and 213 other than the photodiode 211 of the photoelectric converter 21, or the lower bit group counter 31 may be placed in a layer immediately below the other components 212 and 213. The lower bit group counter 31 may include consecutive bits. The consecutive bits may include at least one least significant bit, and one lower bit group counter 31 may be arranged in one layer. The upper bit group counter 32 may be a bit other than the lower bit group counter 31, and may be arranged in one layer or across multiple layers. FIG. 8 illustrates an embodiment in which the upper bit group counter 32 is arranged across multiple layers. For example, the layer in which the lower bit group counter 31 is placed may be referred to as the first layer (e.g., lower bit layer), and the layer in which the upper bit group counter 32 is placed may be referred to as the second layer (e.g., upper bit layer). According to an embodiment, the first layer may be one (or a single layer) layer (e.g., L2 layer), and the second layer may be one or multiple layers (e.g., L3 layer and L4 layer).

For example, the lower bit group counter 31 may include all pixels 20 (e.g., four pixels) belonging to a pixel unit in one layer (L2 layer (first layer)), but the upper bit group counter 32 may be distributed and arranged into at least two groups. For example, the upper bit group counter 32 of the four pixels 20 belonging to the pixel unit may be distributed into two layers (L3 and L4 layers (second layer)) and placed two at a time, or may be distributed into separate layers (L3 to L6 layers (second layer)) and placed one at a time.

The lower bit group counter 31 and the upper bit group counter 32 may be placed in different layers, and the interlayer connection between the layer of the lower bit group counter 31 (L2 layer) and the layer of the upper bit group counter 32 (L3 layer, etc.) may be connected by interlayer connection portions 40, 50, and 60. According to an embodiment, the interlayer connection portion may include an integrated circuit 40 (also referred to as a first integrated circuit), a through electrode 60, and a distribution circuit 50. The lower bit group counter 31 and the upper bit group counter 32 in the same pixel 20 may be connected to each other by the integrated circuit 40 (the first integrated circuit). According to an embodiment, one integrated circuit 40 may be shared by a plurality of pixels of the same pixel unit, and may connect the lower bit group counter 31 and the upper bit group counter 32 of the plurality of pixels. In addition, one interlayer connection portion may be shared by a plurality of pixels 20 (hereinafter referred to as a pixel unit). For example, the pixel unit may include a plurality of pixels 20 that are adjacent or close to each other. For example, as shown in FIG. 1, pixel units 1 to i are formed by four pixels 20 adjacent vertically and horizontally, a plurality of pixels 20 belonging to each pixel unit share one interlayer connection portion, and the lower bit group and the upper bit group of each of the plurality of pixels are connected by the one shared interlayer connection portion. Each bit of the counter 30 is connected to a corresponding signal line and is read by the operation of the switch element. In FIG. 2, the indication of each signal line and switch element is omitted.

According to an embodiment, the components of solid-state imaging device 10, including but not limited to, the photoelectric converter 21, the counter 30, and the processing unit 25, may be implemented as hardware electrical components. For example, these components may be physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The components of solid-state imaging device 10 may, for example, be embodied in one or more semiconductor chips, or on substrate supports such as printed circuit boards and the like. The components of solid-state imaging device 10 may be implemented by dedicated hardware, or by a processor (e.g., one or more programmed microprocessors and associated circuitry), or by a combination of dedicated hardware to perform some functions of the block and a processor to perform other functions of the block.

Hereinafter, the configuration of each layer including the interlayer connection portion and the transmission of signals in the interlayer connection portion are described with reference to FIGS. 3A to 6.

Figure 3B:
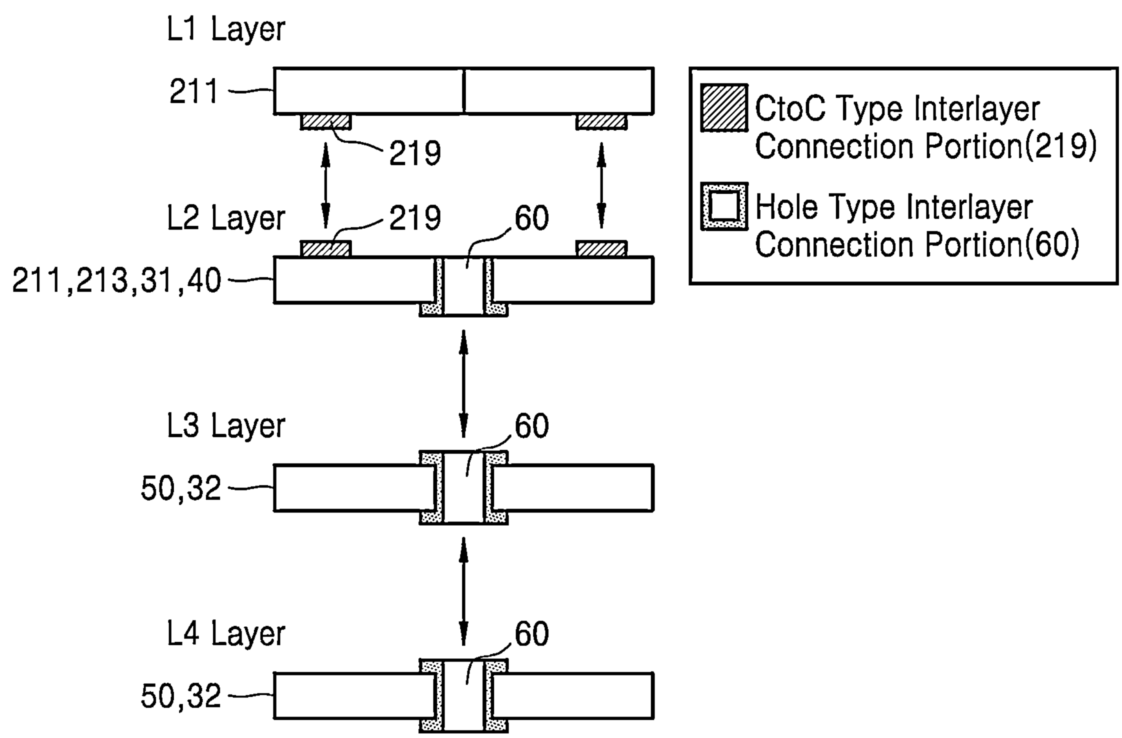
FIG. 3B is a side view showing the stacked structure of the solid-state imaging device.
Figure 3C:
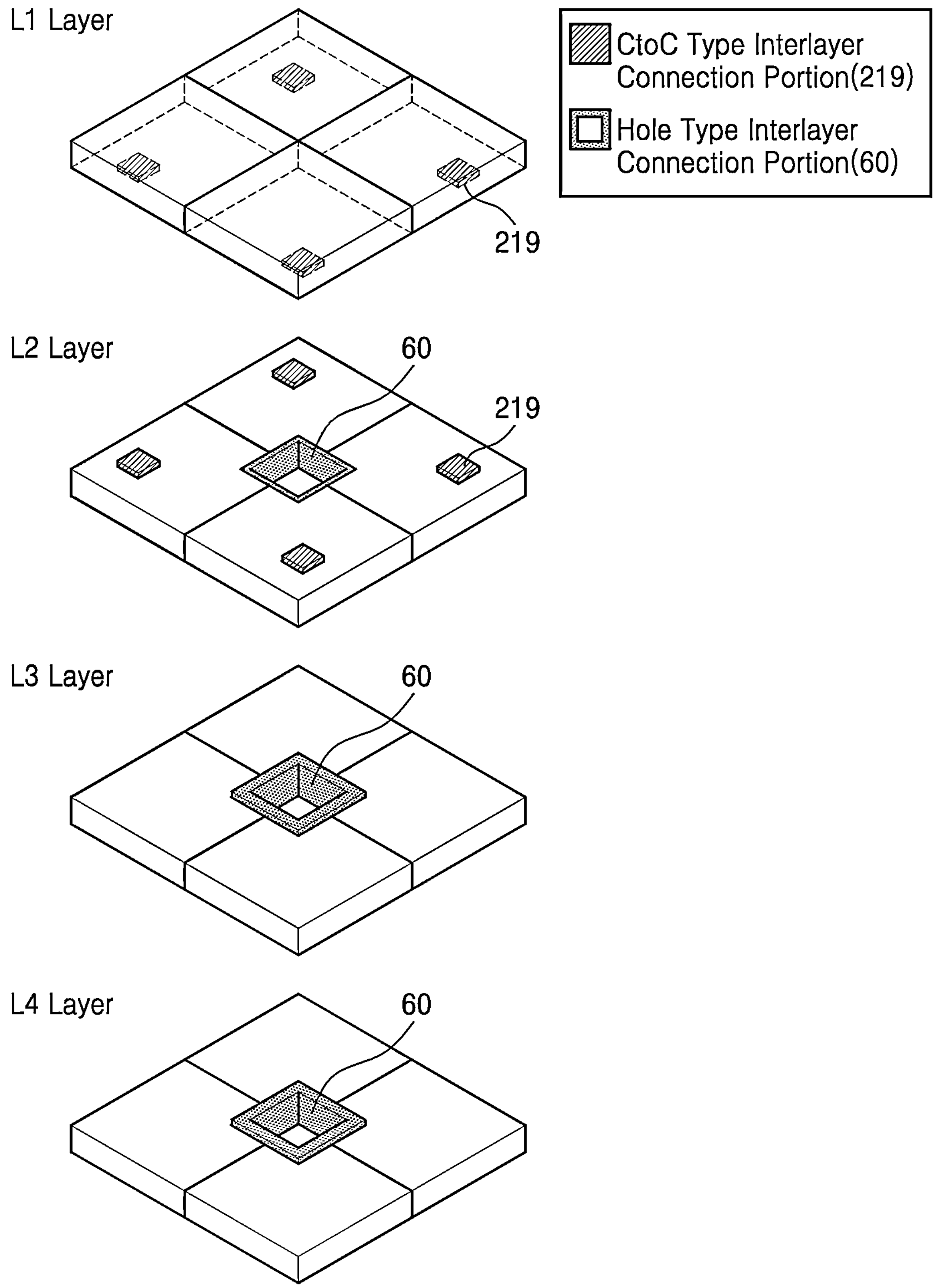
FIG. 3C is a perspective view showing a stacked structure of a solid-state imaging device.

FIGS. 3A to 3C are diagrams showing a stacked structure of the solid-state imaging device 10. FIG. 3A is a top view, FIG. 3B is a side view, and FIG. 3C is a perspective view of the stacked structure of the solid-state imaging device 10. In FIGS. 3A to 3C, for ease of viewing, holes (vias) of the through electrode 60 are shown in different shapes, as shown in shaded region in FIGS. 3A and 3B and in unshaded white region in FIG. 3C, but the holes (vias) of the through electrode 60 may be the same component. In addition, in FIGS. 3A to 3C, only the stacked structure of one pixel unit is shown, and descriptions of other pixel units arranged in an array shape are omitted (the same applies to FIGS. 4, 5, 7 to 10, etc., which are described below). However, the disclosure is not limited thereto, it is noted that, and as such, components of multiple pixel units (pixel units 1 to i) are arranged in one layer.

The pixel 20 of the solid-state imaging device 10 according to an embodiment may have a four-layer structure of the L1 layer, L2 layer, L3 layer, and LA layer. However, the disclosure is not limited thereto, and as such, the number of layers of the pixel 20 of the solid-state imaging device 10 may be different than four. As explained below, according to an embodiment, the lower bit group counter 31 may be formed in the L2 layer (also referred to as the first layer), and the upper bit group may be formed in the L3 layer and L4 layer (hereinafter, these L3 and L4 layers together are also referred to as the second layer), which are different from the L2 layer.

According to an embodiment, the top surface of the L1 layer may be the light incident surface. The L1 layer may be the uppermost layer of the pixel. As shown in FIG. 3A, in the L1 layer, four photodiodes 211 corresponding to the first to fourth pixels 20 (hereinafter, individual pixels are referred to as pixels 0 to 3, etc., and when they are collectively referred to as pixels 20) are arranged.

In L2 layer, which may be provided below the L1 layer, a quench element 212, a waveform shaping element 213 and a lower bit group counter 31 for each of the four pixels 20 may be arranged. The photodiode 211 of the L1 layer, the quench element 212 of the L2 layer, and the waveform shaping element 213 included in the same pixel 20 may be connected through a CtoC connection (Cu to Cu connection) by the CtoC type interlayer connection portion 219 at the same position in the XY coordinates. One interlayer connection unit 219 is provided in each of the plurality of pixels 20. However, the disclosure is not limited thereto, and as such, according to another embodiment, more than one interlayer connection unit 219 may be provided in each of the plurality of pixels 20. In an example case in which a back-illuminated CMOS image sensor is applied as the photodiode 211, the wiring layer (in the case of the backside illumination type, on the lower side, that is, on the side opposite to the incident surface) of the photodiode 211 is located below the L1 layer. The wiring layer of the L1 layer and the wiring layer (top side) of the L2 layer may be connected via CtoC to each other.

In addition, four lower bit group counters 31 respectively corresponding to the four pixels 20 belonging to one pixel unit are connected to one integrated circuit 40. The integrated circuit 40 may be connected to the distribution circuit 50 of the lower L3 and L4 layers through a hole-type interlayer connection portion (hereinafter also referred to as the through electrode 60).

Figure 4:
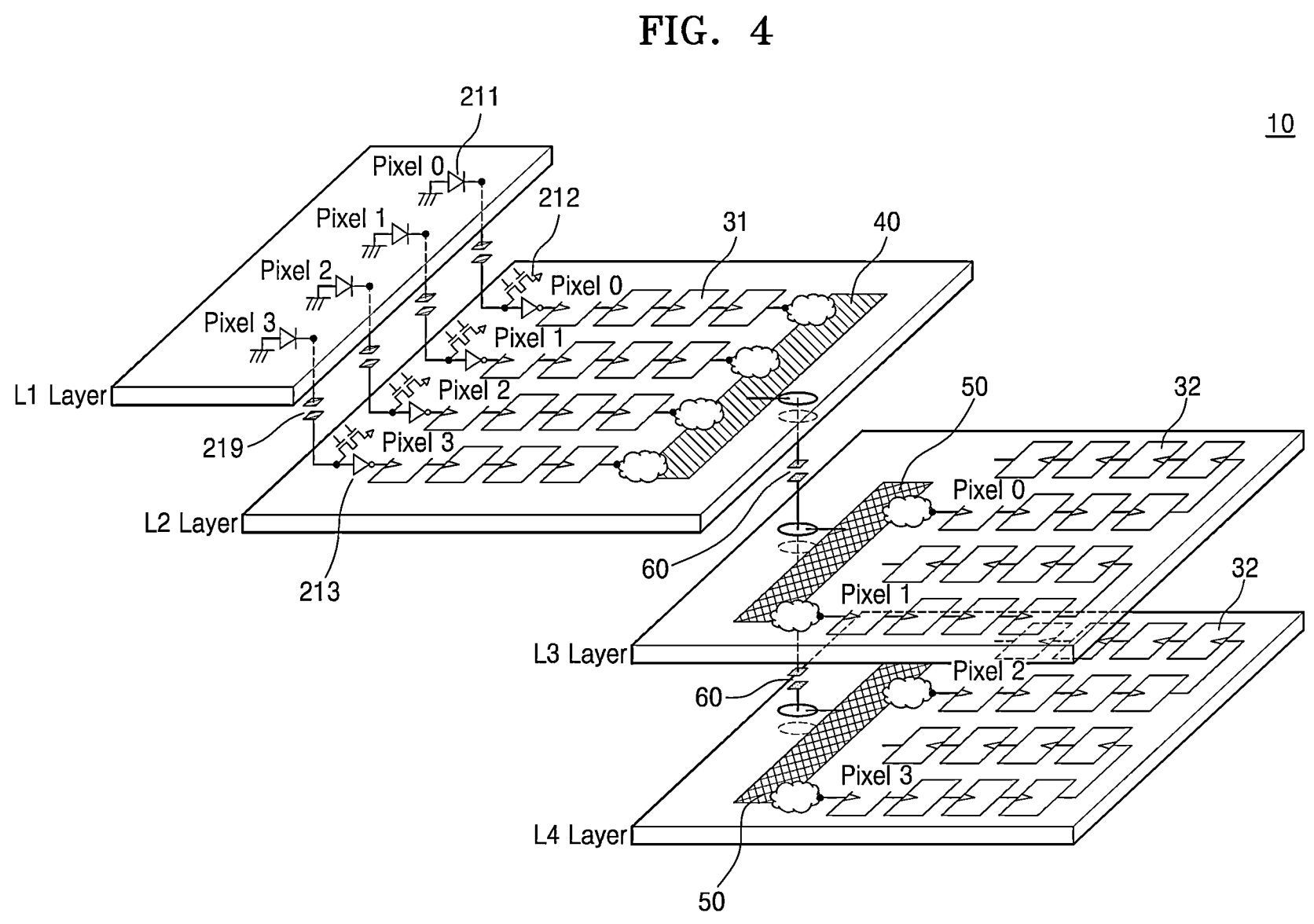
Figure 5:
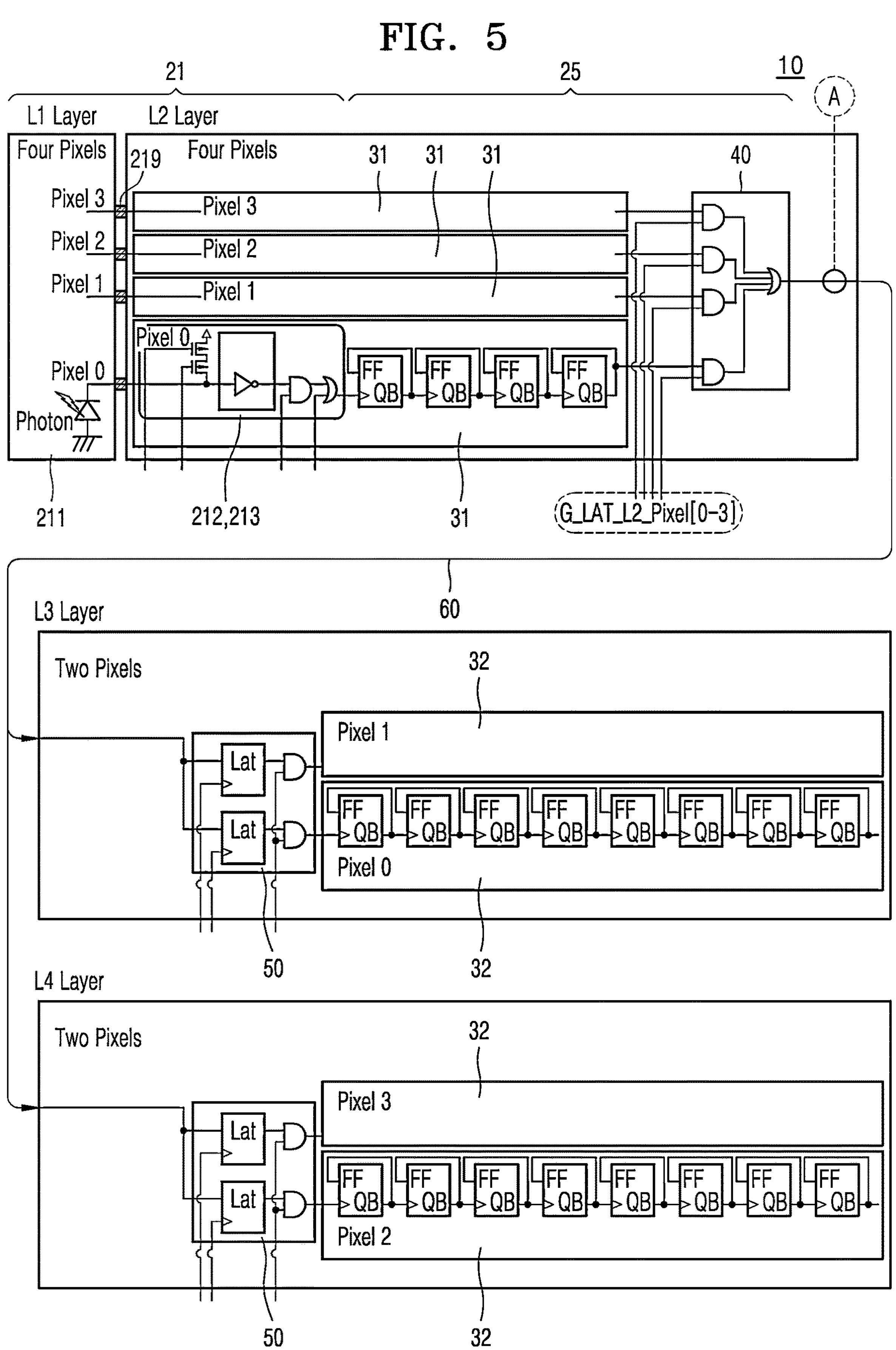
FIG. 5 is a schematic diagram showing a circuit of each layer.

FIG. 4 is a schematic configuration diagram showing an arrangement of each layer and interlayer connections. FIG. 5 is a schematic configuration diagram showing a circuit of each layer. FIGS. 4 and 5 show the solid-state imaging device 10 according to an embodiment, such as the examples shown in FIGS. 3A to 3C, in different terms.

As shown in FIGS. 4 and 5, a photodiode 211 may be provided on the L1 layer. In the L2 layer, a quench element 212, a waveform shaping element 213, a lower bit group counter 31, and an integrated circuit 40 are provided. A 4-bit counter of the lower bit group counter 31 may be a ripple counter with four flip-flops connected. In the same pixel 20, the photodiode 211 of the L1 layer and the quench element 212 and waveform shaping element 213 of the L2 layer immediately below the photodiode 211 of the L1 layer may be connected to each other by a CtoC type interlayer connection portion 219.

According to an embodiment, the integrated circuit 40 and the distribution circuit 50 may perform time division switching.

According to an embodiment, one integrated circuit 40 may be provided in one pixel unit, and a count signal of the lower bit group counter 31 of the plurality of pixels 20 belonging to the pixel unit may be input to the integrated circuit 40.

Figure 6:
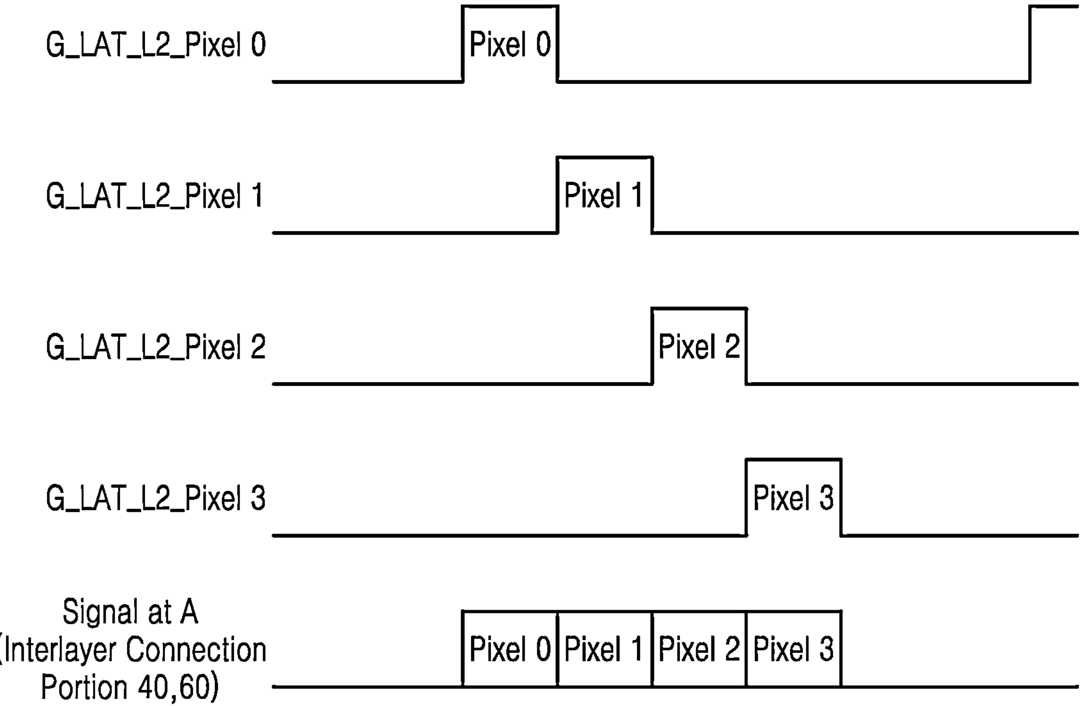
FIG. 6 is a timing chart showing time division signal processing in an interlayer connection portion.

FIG. 6 is a timing chart showing time division signal processing in an interlayer connection portion. In FIG. 6, a timing chart of a control signal applied to the integrated circuit G_LAT_L2 pixels 0 to 3 and the corresponding counter signals flowing through an output side node (label A in FIG. 5) of the integrated circuit 40 for the control signal is illustrated.

A plurality of pixels constituting one pixel unit may share one through electrode 60 as a transmission path for a counter signal. The integrated circuit 40 and the distribution circuit 50 have a time division switching operation that allocates the use of the one through electrode 60 into time divisions. The integrated circuit 40 may synthesize counter signals input from four lower bit group counters 31, each corresponding to one of four pixels, and transmit the synthesized signal to the through electrode 60. The distribution circuit 50 of the output side node of the integrated circuit 40 identifies the counter signal based on a timing of each counter signal, decodes the identified counter signal into an original counter signal for each pixel and transmits the decoded signal to each upper bit group counter 32.

According to an embodiment, the integrated circuit 40 takes the logical product of a control signal of a specific period of which timing is shifted corresponding to the four lower bit group counters 31 and the count signal of the lower bit group counter 31, thereby converting the count signal output to the output side node A of the integrated circuit 40 into time division. The specific period may be predetermined. The distribution circuit 50 may transmit the decoded counter signal to the connected upper bit group counter 32 at timing based on the time slot.

According to an embodiment, a period during which the four pixels 20 are switched over may be set as follows. Each photoelectric converter 21 outputs a pulse signal with a period (interval) based on the amount of incident light. For example, the period becomes shorter as the amount of light increases, and the period is divided by the counter bit of the lower bit group counter 31. In an example case in which the lower bit group counter 31 is 4 bits, the lower bit group counter 31 is divided into 1/16th, so the period may be 16 times. The period of the control signal of the integrated circuit 40 may be set to a period of ½ or less of the period after the frequency of the pulse signal from the photoelectric converter 21 is divided. In this example, because the period is 16 times, a sufficient period of time for transmitting the counter signal for 4 pixels from the lower bit group counter 31 to the upper bit group counter 32 by time division may be secured.

Referring to FIGS. 4 and 5 the through electrode 60 is formed in each pixel unit from the L2 layer to the L4 layer. In addition, the distribution circuit 50 and the upper bit group counter 32 may be provided in the L3 layer. For example, the distribution circuit 50 and the upper bit group counter 32 may be similarly arranged in the L4 layer. The distribution circuit 50 may transmit a counter signal through the through electrode 60. The upper bit group counter 32 of the L3 layer is a counter for about half of the pixels 20 belonging to the pixel unit, and the upper bit group counter 32 of the LA layer is a counter for the remaining pixels 20. Each upper bit group counter 32 may be, for example, an 8-bit counter, and the 8-bit counter may be a ripple counter in which eight flip-flops are connected. For example, in the L3 layer, the upper bit group counter 32 for pixel 0 and pixel 1 among the four pixels 20 (pixels 0 to 3) belonging to one pixel unit may be provided, and the upper bit group counter 32 for the remaining pixels 2 and 3 may be placed in the L4 layer. In FIGS. 4 and 5, only the stacked structure of one pixel unit is shown, description of other pixel units arranged in an array shape is omitted. However, the disclosure is not limited thereto. According to an embodiment, a plurality of components of pixel units 1 to i may be arranged in one layer. For example, in the L3 layer, in addition to pixels 0 and 1, an upper bit group counter 32 of pixels 4, 5, 8, and 9 and the distribution circuit 50 may be provided.

The through electrode 60 may be connected to the input terminal of the distribution circuit 50 of the L3 layer and L4 layer, and the upper bit group counter 32 of each of the plurality of pixels 20 may be connected to the output terminal of the distribution circuit 50 of the L3 layer and L4 layer. A control signal synchronized (or substantially synchronized) with the control signal shown in FIG. 6 may be input to the two distribution circuits 50 of the L3 and L4 layers, and the distribution destination of the counter signal may be switched to the upper bit group counter 32 of any one of pixels 0 to 3 by the synchronized control signal. Thereby, the counter signal may be transmitted between the lower bit group counter 31 and the upper bit group counter 32 of the same pixel 20. For example, the distribution circuit 50 may distribute the counter signal transmitted from the lower bit group counter 31 through the through electrode 60 to the corresponding upper bit group counter 32. For example, during the period when the counter signal of the lower bit group counter 31 of pixel 0 flows through the through electrode 60 by the output from the integrated circuit 40, the distribution circuit 50 of the L3 layer sets the distribution and transfer destination to the upper bit group counter 32 of pixel 0. During this period, the distribution circuit 50 of the L4 layer does not transmit the counter signal to any upper bit group counter 32. In addition, similarly, during the period when the counter signal of the lower bit group counter 31 of pixel 3 flows through the through electrode 60, the distribution circuit 50 of the L4 layer sets the distribution and transfer destination to the upper bit group counter 32 of pixel 3. In this way, the integrated circuit 40, the through electrode 60, and the distribution circuit 50, cooperate to control the connection timing, so that the counter signal of the lower bit group of each pixel 20 may be transmitted to the upper bit group.

In addition, as described above, because the circuit components placed in the L3 layer and the LA layer and their arrangement positions in XY coordinates are the same, when manufacturing the solid-state imaging device 10, the formation of the L3 layer and L4 layer may be performed with a common mask or a mask with a small change scale may be used. For this reason, cost reduction may be achieved.

According to an embodiment, only the photodiode 211 is placed in the L1 layer. Thereby, the area of each photodiode 211 may be increased, or even if the area is the same, it may be arranged at a higher density. In addition, the remaining components (e.g., the quench element 212, and the waveform shaping element 213) of the photoelectric converter 21 may have a low degree of freedom in the arrangement of XY coordinates, considering the analog signal flowing and CtoC connection. Accordingly, the XY coordinate arrangement of the quench element 212 and the waveform shaping element 213 of the L2 layer may be arranged in accordance with the array arrangement of the photodiode 211 of the L1 layer. Meanwhile, the arrangement of each element of the signal processing unit 25 through which digital signals flow may be freely arranged. For example, the signal processing unit 25 through which digital signals flow may not be placed on the layer (L2 layer) immediately below the photodiode 211, but may be placed on other layers (L3 layer and L4 layer). For example, the lower bit group counter 31 of the signal processing unit 25 may be provided on the L3 layer, which is different from the L2 layer in which the photoelectric converter 21 (e.g., the quench element 212 and the waveform shaping element 213) is provided. In this case, in the same pixel 20, the element of the L2 layer (the downstream node of the wave shaping element 213) and the lower bit group counter 31 of the L3 layer may each be connected by a through electrode formed through the silicon substrate.

According to an embodiment, the number of bits (number of flip-flops) of the lower bit group counter 31 arranged in the L2 layer may be as large as possible in order to lengthen the switching cycle in the time division switching operation. However, the number of bits may be limited by the size of the pixel unit. Accordingly, in an embodiment, the number of bits of the counter of the lower bit group counter 31 arranged in the same L2 layer as the components (e.g., the quench element 212 and the waveform shaping element 213) of the photoelectric converter 21 may be 4.

According to an embodiment, the number of bits (number of flip-flops) arranged in the L2 layer, L3 layer, and L4 layer is 4/8/8, but the disclosure is not limited thereto. As such, according to an embodiment, the number of bits may be set to an arbitrary number of bits. For example, the number of bits arranged in the L2 layer, L3 layer, and L4 layer may be 4/4/4, Apr. 12, 2012, etc. In addition, as another example, the number of bits in the L2 layer is not limited to 4 and may be any other number, and may not fill the number of bits in the L3 and L4 layers.

According to an embodiment, rather than arranging the counters of the same pixel separately for the L3 and L4 layers, that is, distributing bit groups of 5 to 8 bits in the L3 layer and 9 to 12 bits in the L4 layer (hereinafter referred to as a comparative example), but may be divided for each pixel. For example, in the L3 layer, the upper bit group of 5 to 12 bits of two pixels (pixels 0 and 1) among the four pixels belonging to the pixel unit may be placed, and the upper bit group of 5 to 12 bits of the remaining two pixels (pixels 2 and 3) may be placed in the LA layer. In the above comparative example, the counter signal must be transmitted across the layers twice in a chain shape with the L2, L3, and L4 layers. In contrast, according to an embodiment, the transfer across layers, such as the L2 layer and the L3 layer or the L2 layer and the L4 layer, may be performed once.

As described above, in an example case in which the number of pixels constituting one pixel unit is even and the L3 layer and L4 layer are equally divided, the L3 layer and L4 layer may have the same configuration. In this case, because it may be manufactured with a common mask, costs may be reduced and the manufacturing preparation period may be shortened. According to an embodiment, in the case where the number of pixels constituting one pixel unit is 9 which is an odd, the L3 to L5 layers may have the same configuration by dividing and arranging 3 pixels in each of the L3 to L5 layers. As another example, the number of pixels constituting one pixel unit does not need to be divided by the number of distributing layers. In this case, it may have a redundancy part. For example, even in a case in which the number of pixels constituting a pixel unit is 16 and distributed to three L3 to L5 layers, it may be manufactured with a common mask by having the redundancy part. In detail, among the 16 pixels, the upper bit groups of pixels 0 to 5, pixels 6 to 11, and pixels 12 to 15 are placed in the L3 to L5 layers, respectively. In this case, in the L5 layer, the upper bit group for 2 pixels becomes an unused area (excessive and useless area), which may be advantageous overall in terms of mask cost and manufacturing cost.

According to an embodiment, in the solid-state imaging device 10, one pixel unit may include four pixels 20, and one set of interlayer connection portions 40, 50, and 60 are shared by the four pixels 20 belonging to the pixel unit. However, the number of pixels 20 sharing an interlayer connection is not limited to four, and may be two or three (corresponding to the embodiment of FIG. 7 below) or five or more. According to an embodiment, the pixels constituting the pixel unit are adjacent pixels 20, but is not limited thereto, and as such, according to an embodiment, the pixel unit may include a plurality of pixels 20 that are not adjacent to each other. For example, the pixel unit may include a plurality of pixels with one or more pixels skipped therebetween.

Figure 7:
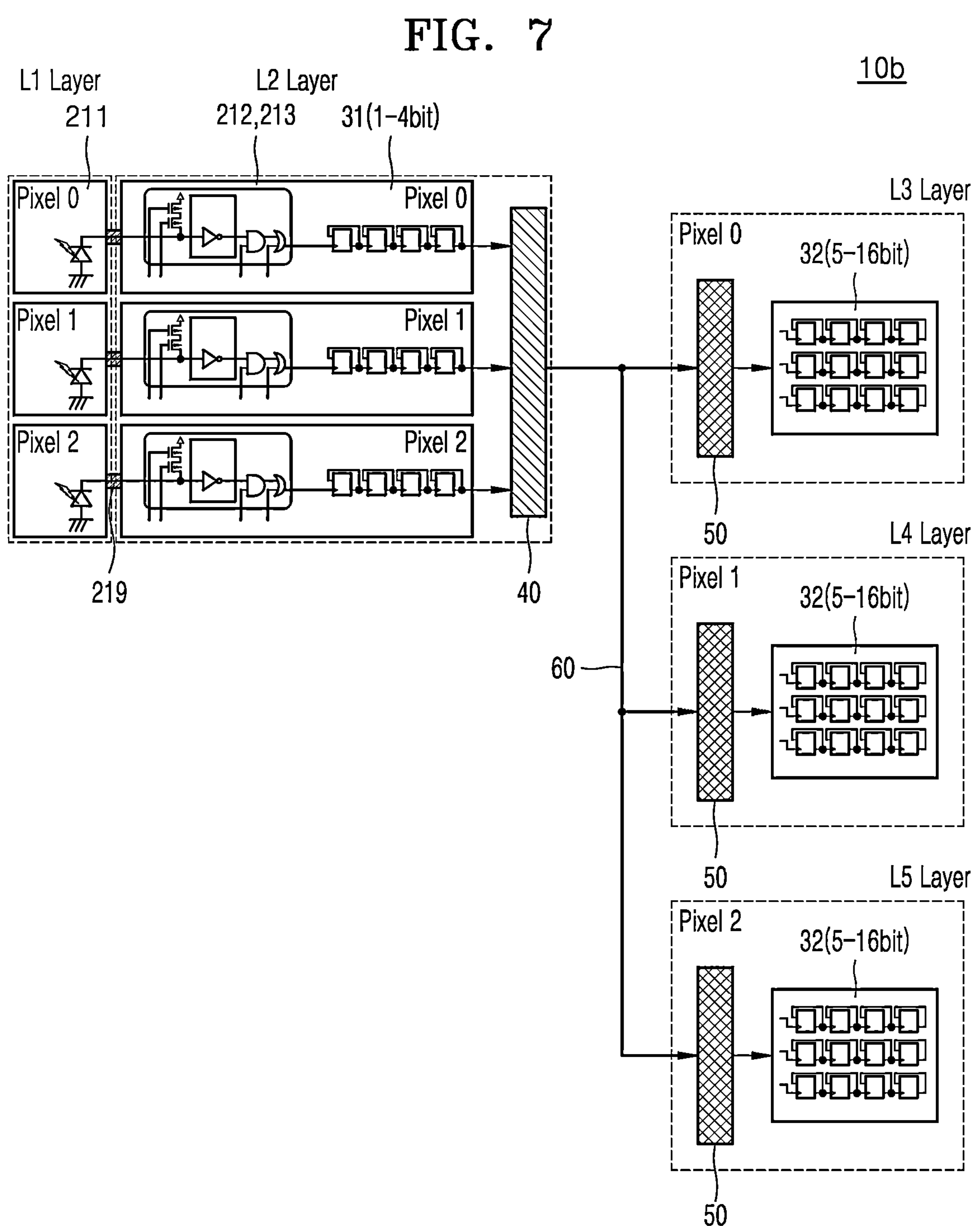
FIG. 7 is a schematic configuration diagram showing the circuit of each layer in the embodiment.

FIG. 7 is a schematic configuration diagram showing the circuit of each layer of a solid-state imaging device **10*b* according to another embodiment. For example, the solid-state imaging device 10*b* described below is an example in which one pixel unit includes three pixels, and one set of interlayer connection portions 40, 50, and 60 are shared within the pixel unit. In addition, compared to the solid-state imaging device 10 illustrated in FIG. 4, which shows an example in which both the photoelectric converter 21 and the signal processing unit 25 are arranged in the L2 layer, in the solid-state imaging device 10*b* illustrated in FIG. 7, the quench element 212 and the waveform shaping element 213 of the photoelectric converter 21, the lower bit group counter 31 of the signal processing unit 25, and the integrated circuit 40 are arranged in the L2 layer. The integrated circuit 40 of the L2 layer may be connected to a through electrode 60 penetrating from the L2 layer to the L5 layer, and may be connected to an upper bit group counter 32 on each layer by the distribution circuit 50** of each layer.

In the L2 layer, a lower bit group counter 31 of 1 to 4 bits of three pixels 0 to 2 may be placed.

The upper bit group counter 32 including 5 to 16 bits of pixel 0 may be placed in the L3 layer, the upper bit group counter 32 including 5 to 16 bits of pixel 1 may be placed in the L4 layer, and the upper bit group counter 32 including 5 to 16 bits of pixel 2 may be placed in the L5 layer. According to an embodiment, the counter signal from the lower bit group counter 31 of the L2 layer may be transmitted to the corresponding upper bit group counter 32 of the L3 to L5 layers by the time division switching operation of the integrated circuit 40 and distribution circuit 50.

Figure 9:
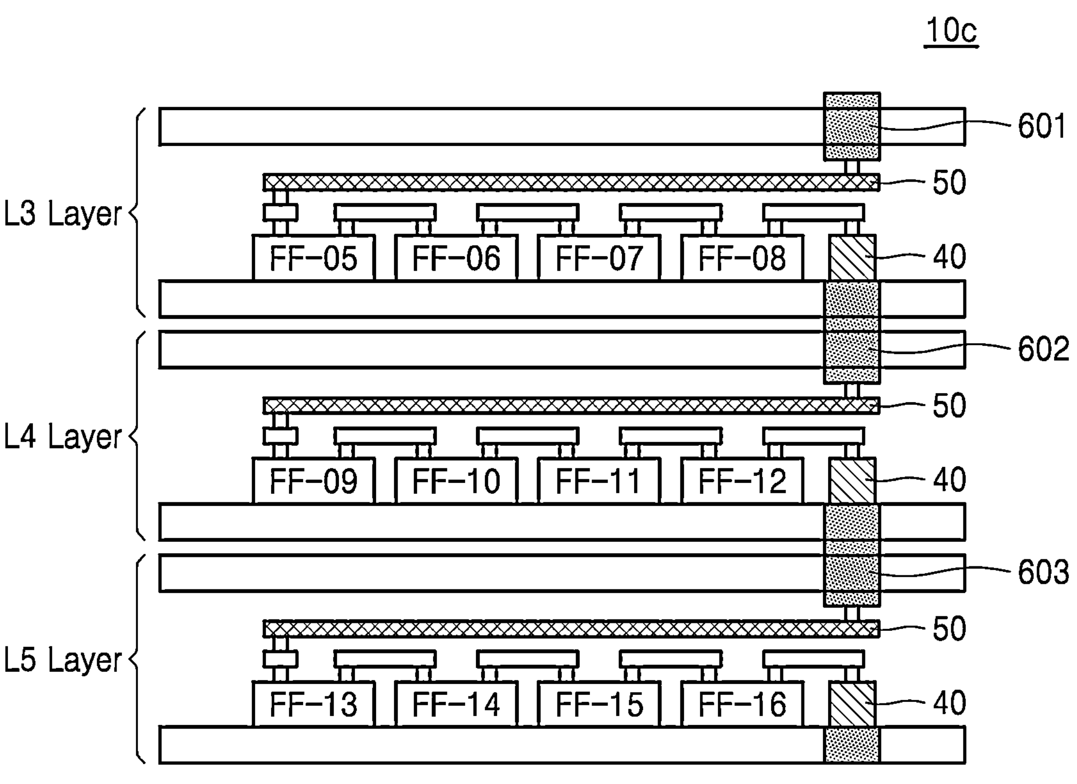
FIG. 9 is a schematic diagram showing an interlayer connection configuration of each layer in the embodiment of FIG. 8.

FIG. 8 is a schematic configuration diagram showing the circuit of each layer of a solid-state imaging devices 10*c* according to another embodiment, and FIG. 9 is a schematic configuration diagram showing the interlayer connection configuration of each layer. FIG. 9 is a side view of the L3, L4 and L5 layers. In FIG. 9, the flip-flops constituting each bit (bits 5 to 16) of the counter 30 of the L3, L4, and L5 layers are shown along with the bit numbers. For example, in FIG. 9, FF-05 may represent the counter element corresponding to the 5th bit of the counter 30. In the solid-state imaging devices 10 and 10*b* illustrated in FIGS. 4 and 7, respectively, a single through electrode 60 penetrating a plurality of layers was used as an interlayer connection portion, but in the solid-state imaging device 10*c* of FIGS. 8 and 9 described below, a plurality of through electrodes 601 to 603 that penetrate only between adjacent layers are illustrated. The solid-state imaging device 10*c* may be the same as the solid-state imaging device 10*b*, in that, one pixel unit includes three pixels, but is not limited thereto, and the number of pixels included in a pixel unit may be two or four or more. In addition, in the solid-state imaging device 10*c*, the counter of one pixel 20 may be configured with 16 bits, and the counter including the 16 bits may be divided into one lower bit group counter 31 and three upper bit group counters 32 of 4 bits each and placed in four layers, L2 to L5 layers. However, the counter is not limited to the form shown in FIGS. 8 and 9, and the number of bits of the counter arranged in each layer may be set to any number. In the solid-state imaging device 10*c*, counter signals between adjacent layers are transmitted to the bit group of the corresponding counter by the time division switching operation of the integrated circuit 40 and the distribution circuit 50. In an example case in which the counter is arranged in the L2 layer and the L3 layer, the counter signal of the corresponding lower bit group counter 31 of the same pixel may be transmitted to the upper bit group (5 to 8 bits) through the through electrode 601 by the integrated circuit 40 and distribution circuit 50.

With the configuration of the solid-state imaging device 10*c* illustrated in FIGS. 8 and 9, the number of through electrodes 601 to 603 in each layer may be reduced to less than the number of pixels 20. In the solid-state imaging device 10*c*, this may be reduced to one-third. In addition, the XY coordinate positions of interlayer connection electrodes (the through electrodes 601 to 603 and the interlayer connection portion 219) in the L2 to L5 layers may be made the same. In addition, furthermore, the number of counter elements (flip-flops) to be placed in the L2 to L5 layers may be filled and placed at the same XY coordinate position. As such, in the solid-state imaging device 10*c*, the components of the circuit arranged in the L2 to L5 layers and arrangement positions thereof in XY coordinates may be the same. Therefore, in the case of manufacturing the solid-state imaging device 10, because the formation of the L2 to L5 layers may be manufactured using a common mask, costs may be reduced and the manufacturing preparation period may be shortened.

Figure 10:
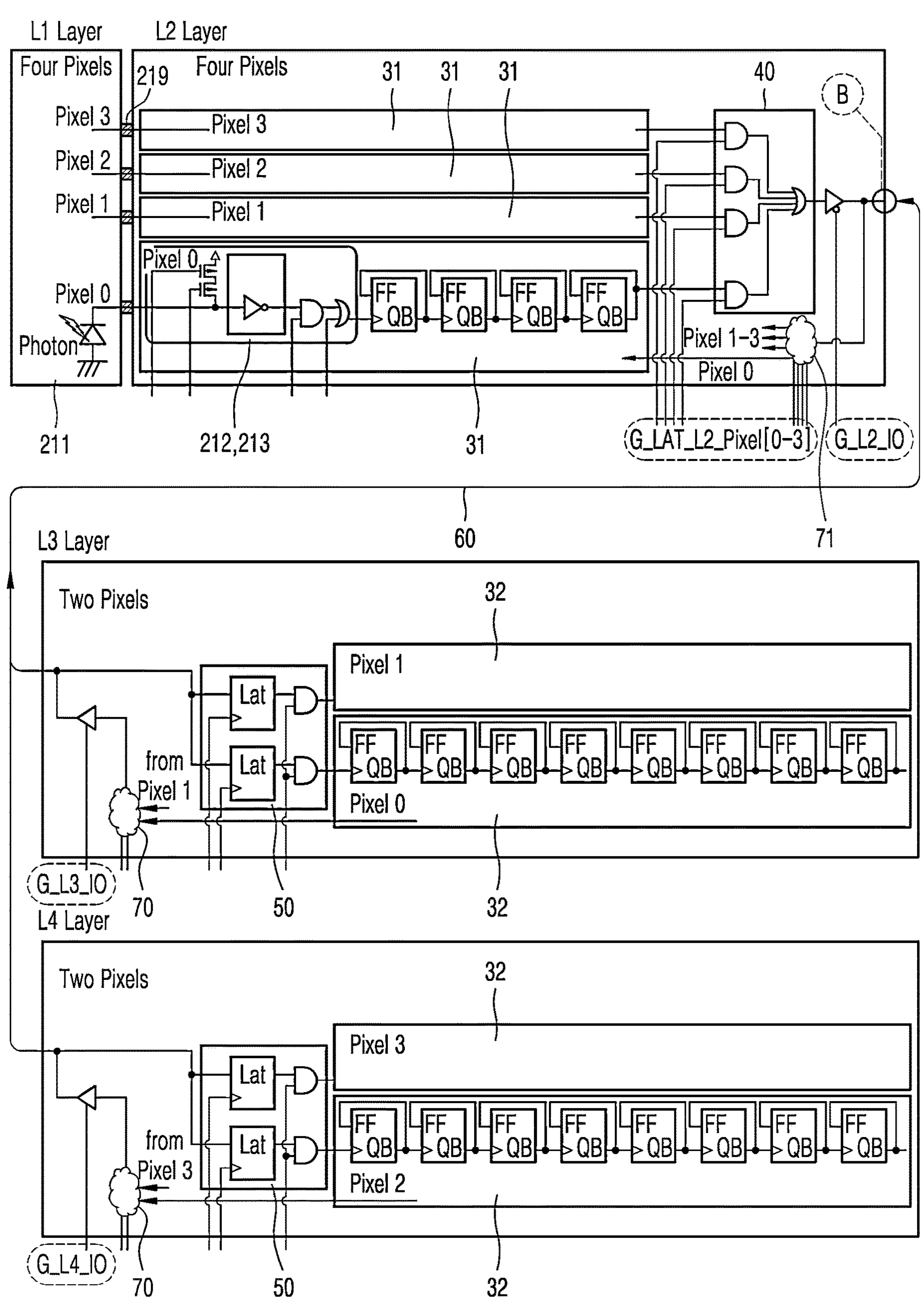
FIG. 10 is a schematic configuration diagram showing a circuit of each layer of a solid-state imaging device according to an embodiment.
Figure 11:
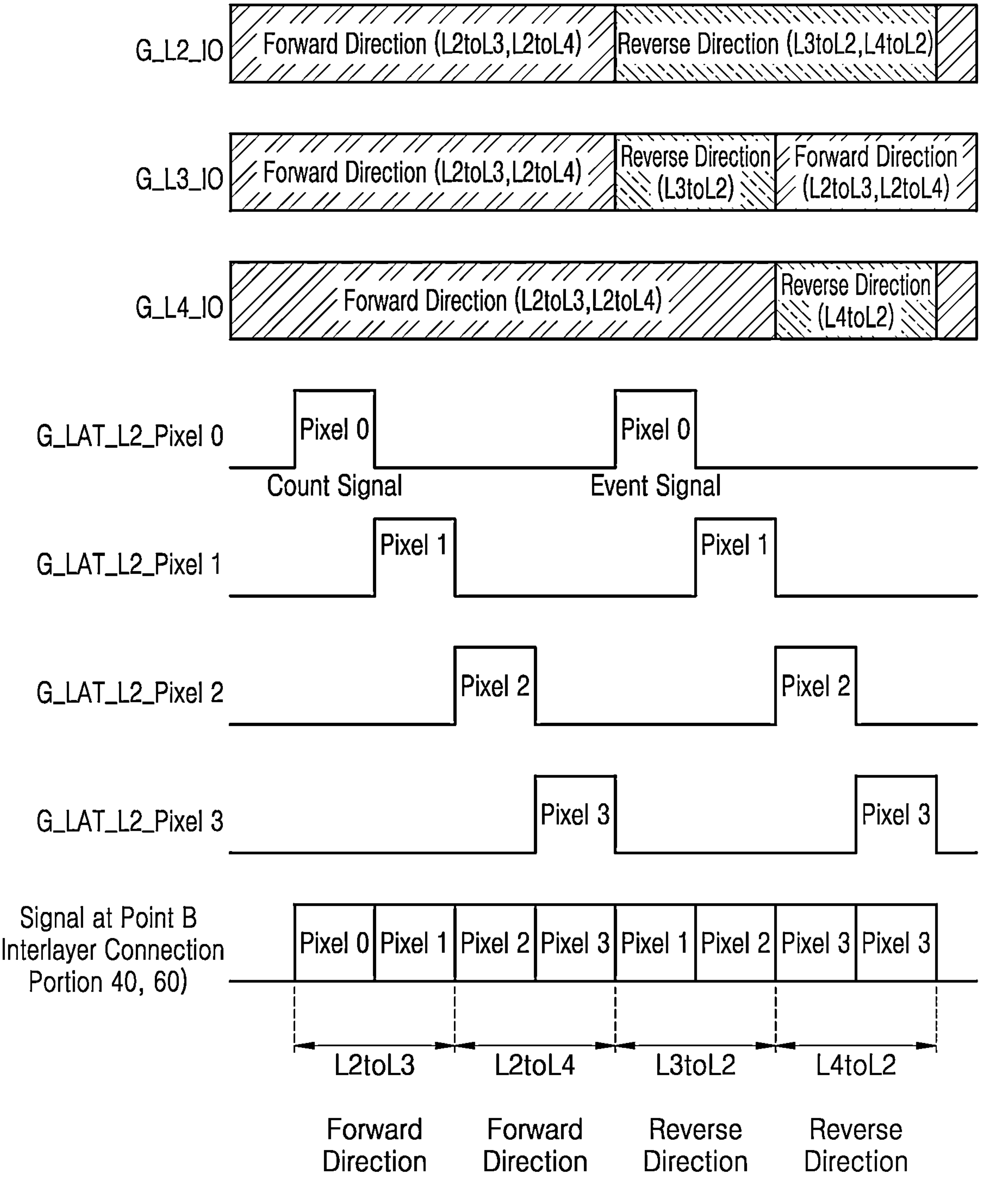
FIG. 11 is a timing chart showing time division signal processing in an interlayer connection portion.

FIG. 10 is a schematic configuration diagram showing the circuit of each layer of a solid-state imaging device 10*d* according to an embodiment, and FIG. 11 is a timing chart showing time division signal processing in the interlayer connection portion. Compared to the solid-state imaging device 10 shown in FIG. 5, the solid-state imaging device 10*d* shown in FIG. 10 further includes a distribution circuit 71 in the L2 layer and an integrated circuit 70 in each of the L3 and LA layers.

The solid-state imaging device 10*d* according to an embodiment may transmit an event signal related to a specific event occurring in the upper bit group counter 32 from the second layer (L3 and L4 layer, etc.) to the first layer (L2 layer) through the interlayer connection electrode (through electrode 60). The operation of sending this event signal from the lower layer to the upper layer through the time division operation may be processed by the added integrated circuit 70 and distribution circuit 71 as described below.

For example, the event signal relates to an event when counter carryover (digit overflow) of the upper bit group counter 32 occurs due to too much light incident on the photodiode 211. For example, the event signal may occur in an example case in which an amount of light incident on the photodiode 211 is greater than a reference value.

In an example case in which a specific event occurs, the upper bit group counter 32 generates an event signal and transmits the signal to the integrated circuit 70 on the same layer. The integrated circuit 70 integrates signals for two pixels on the same layer. For example, the integrated circuit 70 in the L3 layer integrates the event signals of pixels 0 and 1 and transmits the integrated event signals to a distribution circuit 71 in the L2 layer through the through electrode 60. The distribution circuit 71 that receives the integrated event signal sends the integrated event signals to one pixel corresponding to the pixel of the transmitter. The pixel that receives the integrated event signals performs processing according to the event signal. In an example case in which the event signal is a signal of counter carryover, the photodiode stops receiving light. This process stops light reception (exposure) even within the exposure period, for example, by logical sum of the exposure control signal and the event signal.

According to an embodiment, the integrated circuit 70 and the distribution circuit 71 may perform time division switching.

As shown in FIG. 10, two integrated circuits 70 corresponding to the number of layers (L3 and L4 layers) in which the upper bit group counters 32 are arranged in one pixel unit are illustrated. The event signal of the upper bit group counter 32 of each of the plurality of pixels 20 in each layer is input to this integrated circuit 70. FIG. 11 shows control signals G_LAT_L2 pixels 0 to 3 to the integrated circuit 70 and distribution circuit 71, control signals G_L2_IO and G_L3_IO (both are surrounded by a dashed border in FIG. 10) of the upstream gate of the integrated circuit 70 and the downstream gate of the distribution circuit 71, and a counter signal and an event signal flowing through the path (label B in FIG. 10) of the corresponding integrated circuit 70 and distribution circuit 71. The counter signal is transmitted from the upper layer to the lower layer (hereinafter referred to as forward direction), and the event signal is transmitted from the lower layer to the upper layer (hereinafter referred to as the reverse direction).

The integrated circuit 70 and distribution circuit 71 have a time division switching operation. Because the time division operation for the counter signal flowing in the forward direction in FIG. 11 is the same as that in FIG. 6, description thereof is omitted. In the embodiment shown in FIGS. 10 and 11, in order to convert the signal flowing through one through electrode 60 into time division, not only the counter signal but also the time slot through which the event signal flows may be secured in advance.

In a cycle in which the four pixels 20 are switched once, the counter signals of pixels 0 to 3 may flow sequentially from the L2 layer toward the L3 or L4 layer in the forward direction for the first half of the cycle. In the cycle, the event signals of pixels 0 and 1 from the L3 layer toward the L2 layer may flow in the reverse direction in the second half of the cycle, and then the event signals of pixels 2 and 3 from the L4 layer toward the L2 layer may flow sequentially. In this way, in an example case in which the integrated circuit 70 and the distribution circuit 71 share one through electrode 60, the direction in which the signal of the through electrode 60 flows and the transmission path may be switched in time division.

According to another embodiment, signal transmission between the L3 layer and the LA layer may be performed. For example, in FIG. 11, time slots may be assigned to transmit signals from the L3 to the L4 layer (or vice versa), and a signal may be transmitted from the integrated circuit 70 of the L3 layer to the distribution circuit 50 of the L4 layer through the through electrode 60. According to an embodiment, the transmission direction of the signal flowing through the through electrode 60 due to the time division switching operation is not limited to the forward direction and may also be in the reverse direction.

Below, processing in binning mode is described with reference to FIGS. 12 to 16.

Figure 12:
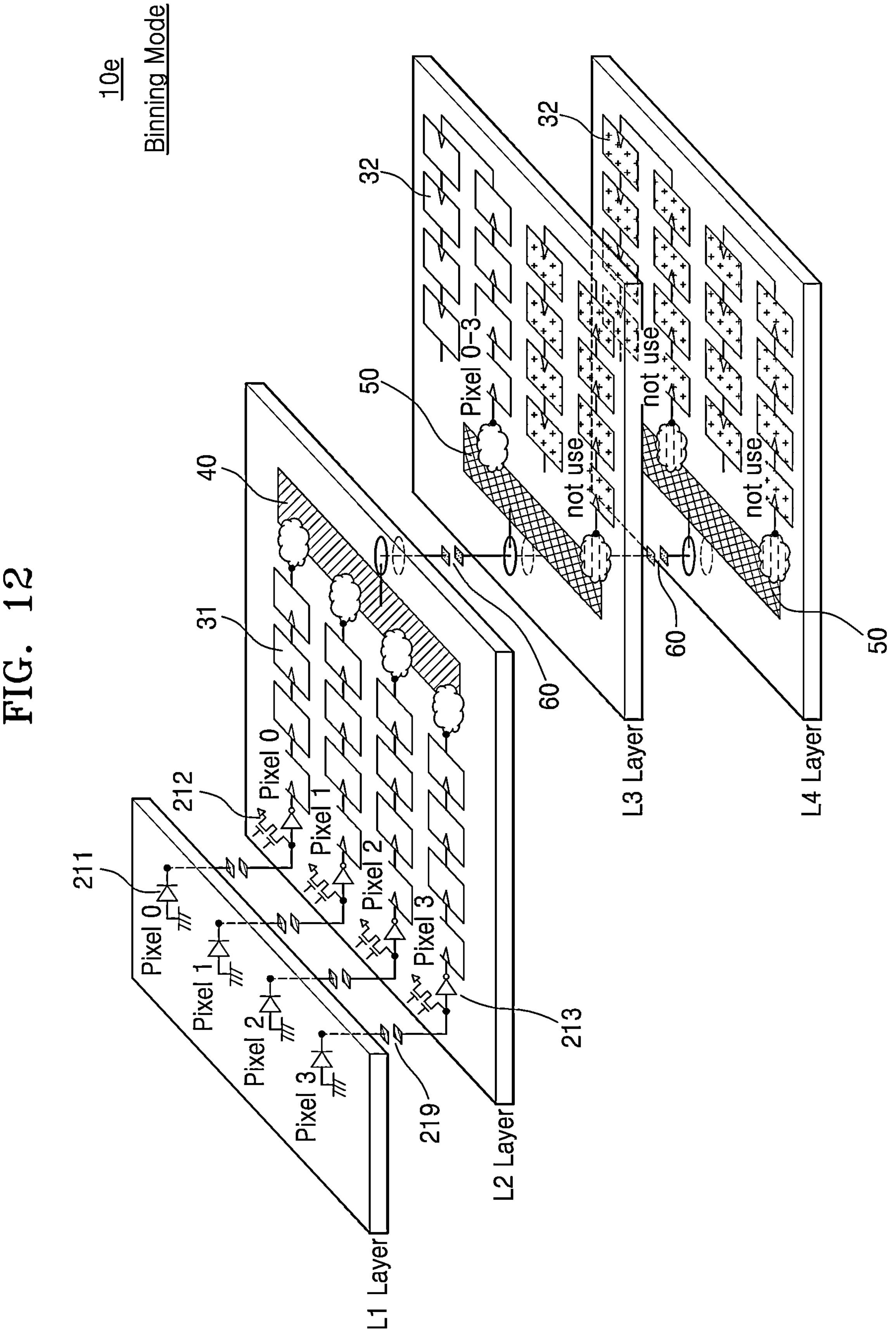
FIG. 12 is a schematic configuration diagram showing a circuit of each layer and interlayer connections of a solid-state imaging device according to an embodiment.
Figure 13:
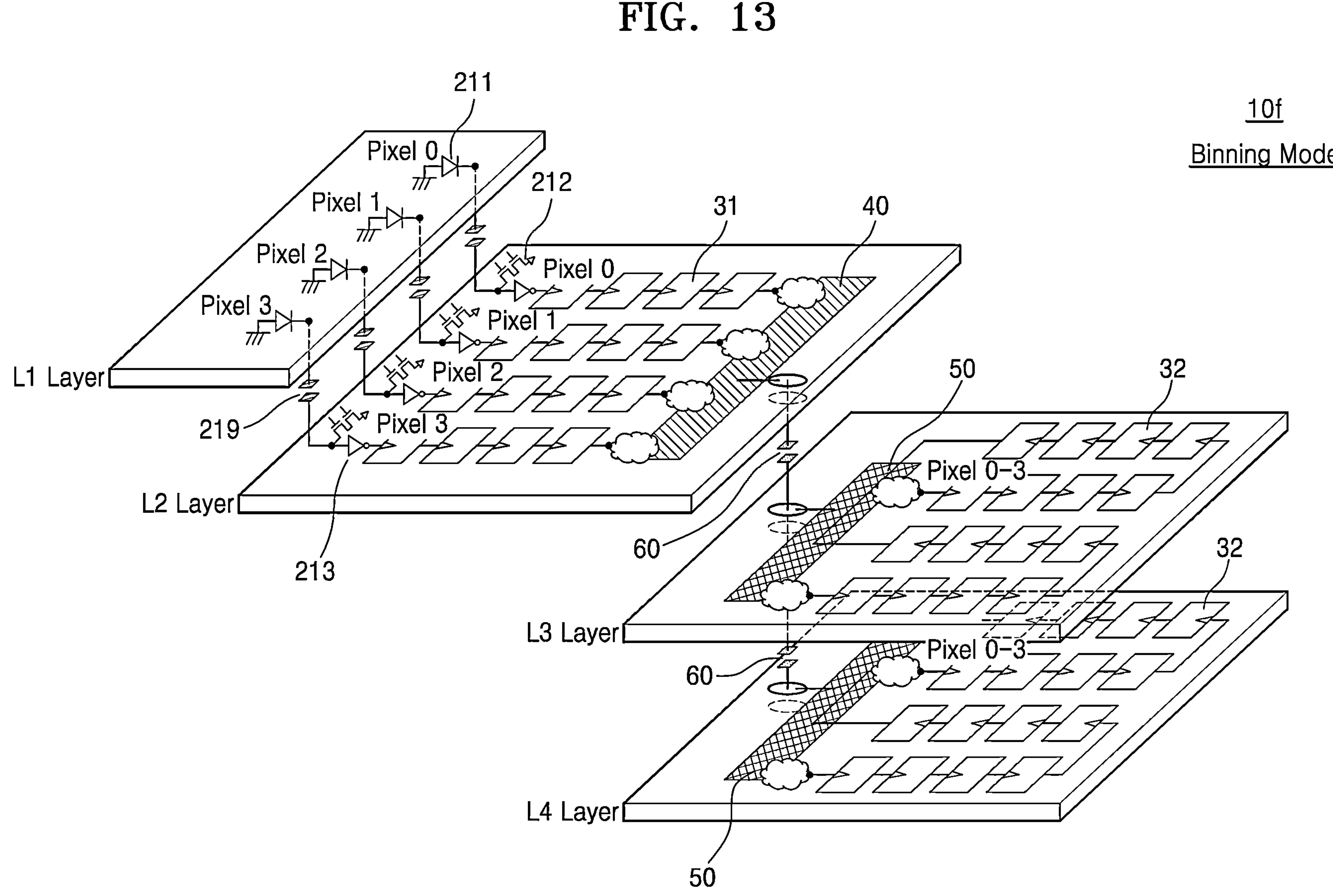
FIG. 13 is a schematic configuration diagram showing a circuit of each layer and interlayer connections of a solid-state imaging device in an embodiment.

FIG. 12 is schematic configuration diagram showing the circuits and interlayer connections of each layer of a solid-state imaging device 10*e* according to another embodiment. FIG. 13 is schematic configuration diagram showing the circuits and interlayer connections of each layer of a solid-state imaging device 10*f* according to another embodiment. According to an embodiment, in the binning mode, the integrated circuit 40 may add or average the counter signals of the lower bit group counter 31 of a plurality of pixels belonging to one pixel unit and transmit the added or averaged counter signals to the upper bit group counter 32 as data for one pixel. In the case of normal mode rather than binning mode, the integrated circuit 40 and the like perform the operation as shown in FIGS. 4 to 6. Compared to the binning mode, which adds or averages the counter signals of multiple pixels and outputs the added or averaged counter signals, in the normal mode, a counter signal for each pixel may be output.

According to an embodiment illustrated in FIG. 12, in binning mode, the solid-state imaging device 10*e* may add or average the counter signals of the lower bit groups of four horizontally and vertically adjacent 2×2 pixels and transmit the added or averaged counter signals to the upper bit group counter 32 of the L3 layer through the through electrode 60. In addition, in the binning mode, only the upper bit group counter 32 for pixel 0 in the L3 layer is valid. Additionally, the upper bit groups for other pixels 1 to 3 are invalidated and not used. By invalidating the counters of the upper bit group for pixels 1 to 3, the signal information required for propagation to these circuits may be reduced, thereby reducing the power consumption of the circuit at the subsequent stage. In addition, in an example case in which the solid-state imaging device 10*e* is configured exclusively for binning mode, these subsequent circuits may be reduced.

According to an embodiment illustrated in FIG. 13, the counters of four pixels may all be used as the counter of one pixel. For example, by connecting four 8-bit counters of the upper bit group counter 32, it may be used as a single 32-bit counter of the upper bit group, and by combining the single 32-bit counter with the 4-bit counter of the lower bit group counter 31, it may be used as a counter of a total of 36 bits. For example, the connections are made in the order of the upper bit groups for pixels 0, 1, 2, and 3.

In the binning mode, the solid-state imaging device 10*e* adds the lower bit group counter 31 of the four pixels 20 and transmits the sum to the upper bit group counter 32 for pixel 0 of the L3 layer through the through electrode 60. Thereafter, whenever a counter signal is input, the counter signal is transmitted to a downstream upper bit group counter 32. In this case, a counter signal flowing from the L2 layer to the L3 layer and a counter signal flowing from the L3 layer to the LA layer flow through the through electrode 60. The plurality of counter signals flowing through these through electrodes 60 are switched by the time division switching operation of the integrated circuit 40 and distribution circuit 50.

According to an embodiment, by connecting (in series) the four upper bit group counters 32 at the rear end, a 36-bit counter may be realized by combining the connected four upper bit groups with the lower bit group counter 31, thereby expanding the dynamic range. The number of bits of the counter used or the layer used may be freely changed. For example, the counter may operate as a 16-bit counter by connecting only the two upper bit group counters 32 of the L3 layer.

In this way, in the solid-state imaging devices 10*d* and 10*e*, by executing the binning mode, the pixel information is not reduced, but data for 4 pixels belonging to one pixel unit may be treated as extended data for 1 pixel, so the pixel resolution is reduced by a quarter, but the light-receiving area per pixel is quadrupled, resulting in higher sensitivity, allowing image capturing even in dark environments with low light levels.

Figure 14:
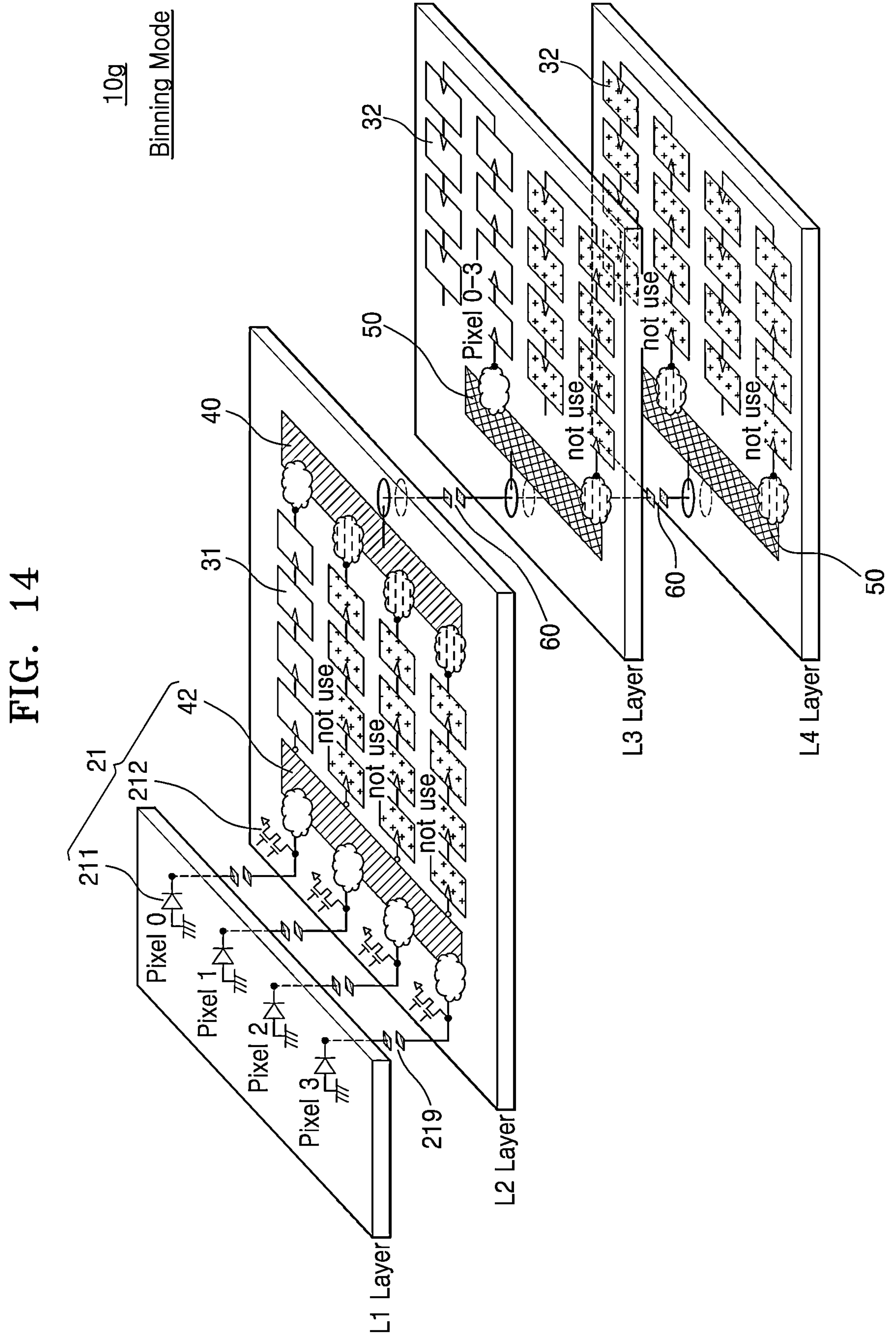
FIG. 14 is a schematic configuration diagram showing a circuit of each layer and interlayer connections of a solid-state imaging device according to an embodiment.
Figure 15:
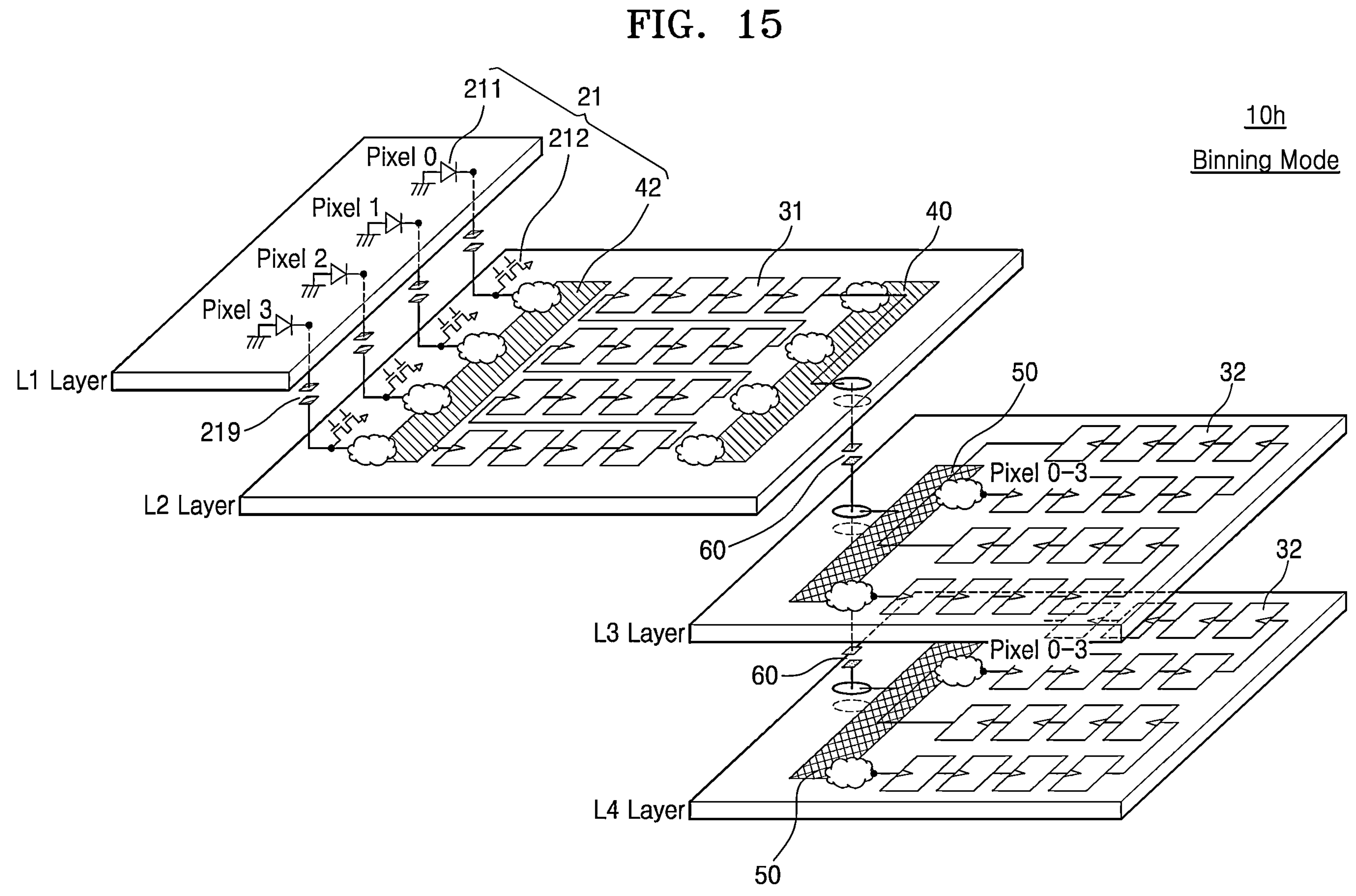
FIG. 15 is a schematic configuration diagram showing a circuit of each layer and interlayer connections of a solid-state imaging device in an embodiment.

FIG. 14 is schematic configuration diagram showing the circuits and interlayer connections of each layer of a solid-state imaging device 10*g* according to another embodiment. FIG. 15 is schematic configuration diagram showing the circuits and interlayer connections of each layer of a solid-state imaging device 10*h* according to another embodiment. According to an embodiment, the binning process was performed in the signal processing unit 25 through which digital signals flow, but in the solid-state imaging devices 10*g* and 10*h*, an integrated circuit 42 (also referred to as a second integrated circuit) is provided in a photoelectric converter 21, and the integrated circuit 42 performs integration of analog signals in front of the signal processing unit 25. The integrated circuit 42 is connected to photodiodes 211 (and quench elements 212) of a plurality of pixels (pixels 0 to 3), and optical signal output from the plurality of photodiodes 211 is input to the input terminal of the integrated circuit 42. The integrated circuit 42 may perform addition or averaging processing on the optical signal outputs of these plural pixels and output the added or averaged signal to the lower bit group counter 31 as a pulse signal for one pixel. According to an embodiment, in the solid-state imaging devices 10*g* and 10*h*, a normal photodiode that outputs an analog signal may be used as the photodiode 211, instead of a SPAD. In addition, the integrated circuit 42 may operate as a waveform shaping element 213 provided in each pixel 20 in normal mode (see FIG. 2).

According to an embodiment shown in FIG. 14, in the binning mode, the optical signal outputs of four pixels 20 that are horizontally and vertically 2×2 adjacent are added by the integrated circuit 42 and transmitted to the lower bit group counter 31 as a pulse signal. In addition, in binning mode, only the lower bit group counter 31 for pixel 0 in the L2 layer and the upper bit group counter 32 for pixel 0 in the L3 layer are valid, and the counters of other lower bit group counters 31 and upper bit group counters 32 for pixels 1 to 3 are invalid and not used. By invalidating the counters of the lower bit group counter 31 and the upper bit group counter 32 for pixels 1 to 3, the signal information required for propagation to these circuits may be reduced, thereby reducing the power consumption of the counter circuit at the subsequent stage. In addition, in an example case in which the solid-state imaging device 10*e* is configured exclusively for binning mode, the counter circuits may be reduced.

According to an shown in FIG. 15 utilizes the invalidated counter circuit as in the example shown in FIG. 13 to use all counters for four pixels as counters for one pixel. In detail, the lower bit group counter 31 connects 4 pixels and operates as a 16-bit counter. In addition, the upper bit group counter 32 also operates as a 32-bit counter by connecting 4 pixels. By connecting them, the upper bit group counter 32 operates as a counter with a total of 48 bits. According to an embodiment, a counter signal flowing from the L2 layer to the L3 layer and a counter signal flowing from the L3 layer to the L4 layer flow through the through electrode 60. A plurality of counter signals flowing through these through electrodes 60 may be switched by a time division switching operation by the integrated circuit 40 and the distribution circuit 50.

Figure 16:
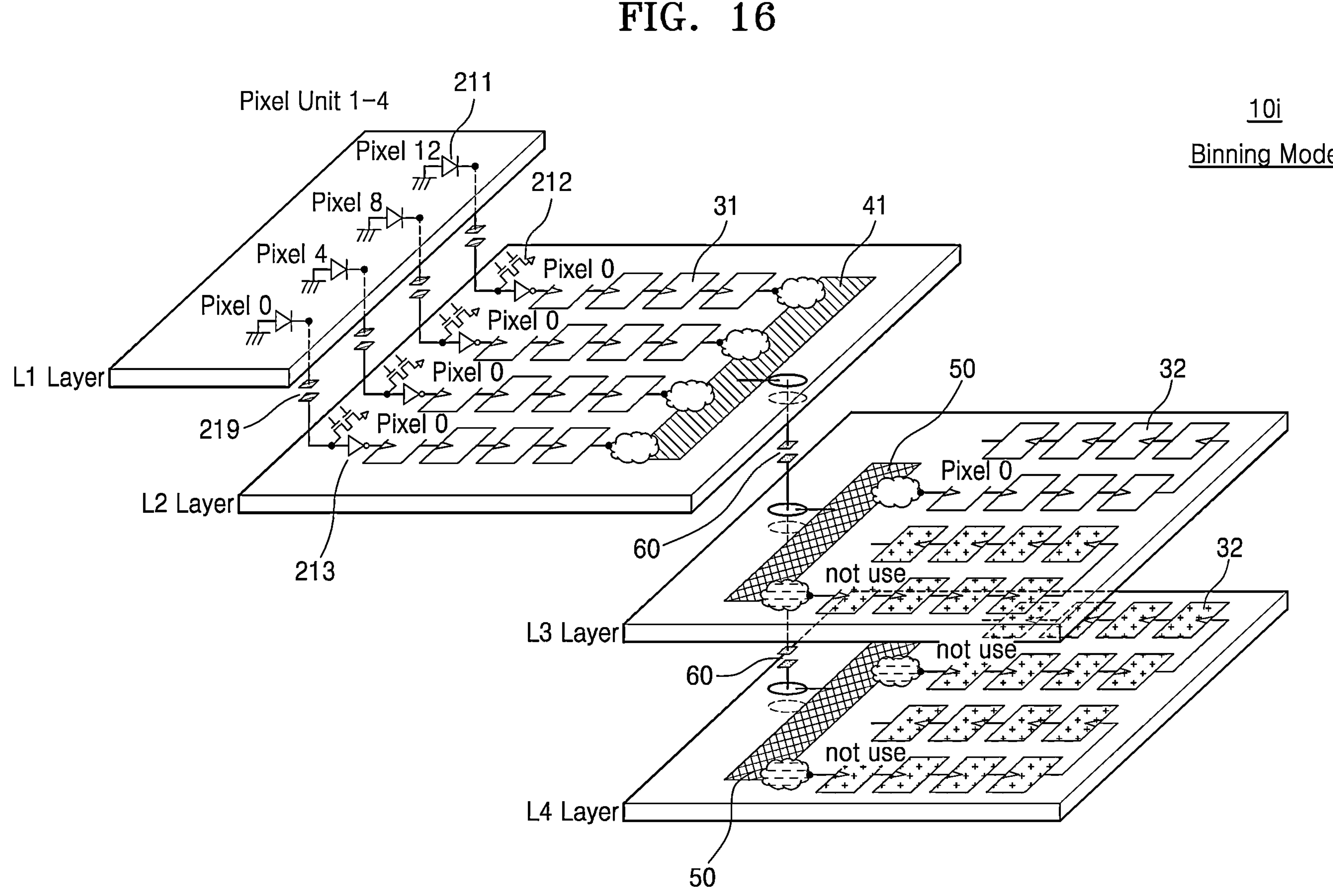
FIG. 16 is a schematic configuration diagram showing a circuit of each layer and interlayer connections of a solid-state imaging device in an embodiment.

FIG. 16 is a schematic configuration diagram showing the circuit and interlayer connections of each layer of the solid-state imaging device 10*i* according to another embodiment.

According to an embodiment, the solid-state imaging device 10*i* may recombine pixel units into normal mode and binning mode. For example, in the Bayer array, R, G, G, and B optical filters are placed in adjacent pixels 0 to 3 horizontally and vertically 2×2, respectively. In normal mode, the pixel unit may include four pixels (pixels 0 to 3) of 2×2 in width and height. Meanwhile, in binning mode, in a solid-state imaging device 10*i*, four pixel units 1 to 4 (see FIG. 1) measuring 2×2 are treated as large-size pixel units (a total of 16 pixels 0 to 15 for the four small-size pixel units belong to the four pixel units). Also, among the pixels belonging to the large-size pixel unit, four pixels equipped with an R filter, pixels 0, 4, 8, and 12, are treated as one set, and the counter signals of these pixels are added or averaged by the integrated circuit 40. In FIG. 16, only examples of binning processing in pixels of the R filter are shown, and examples of binning processing in the G1, G2, and B filters are omitted. By using the same configuration as the solid-state imaging device 10*i* shown in FIG. 16, signals for each color may be handled. The recombinable configuration or processing of the pixel unit may also be applied to other embodiments. For example, a configuration or process capable of recombining pixel units may also be used in combination with each embodiment of FIGS. 13 to 15.

Figure 17:
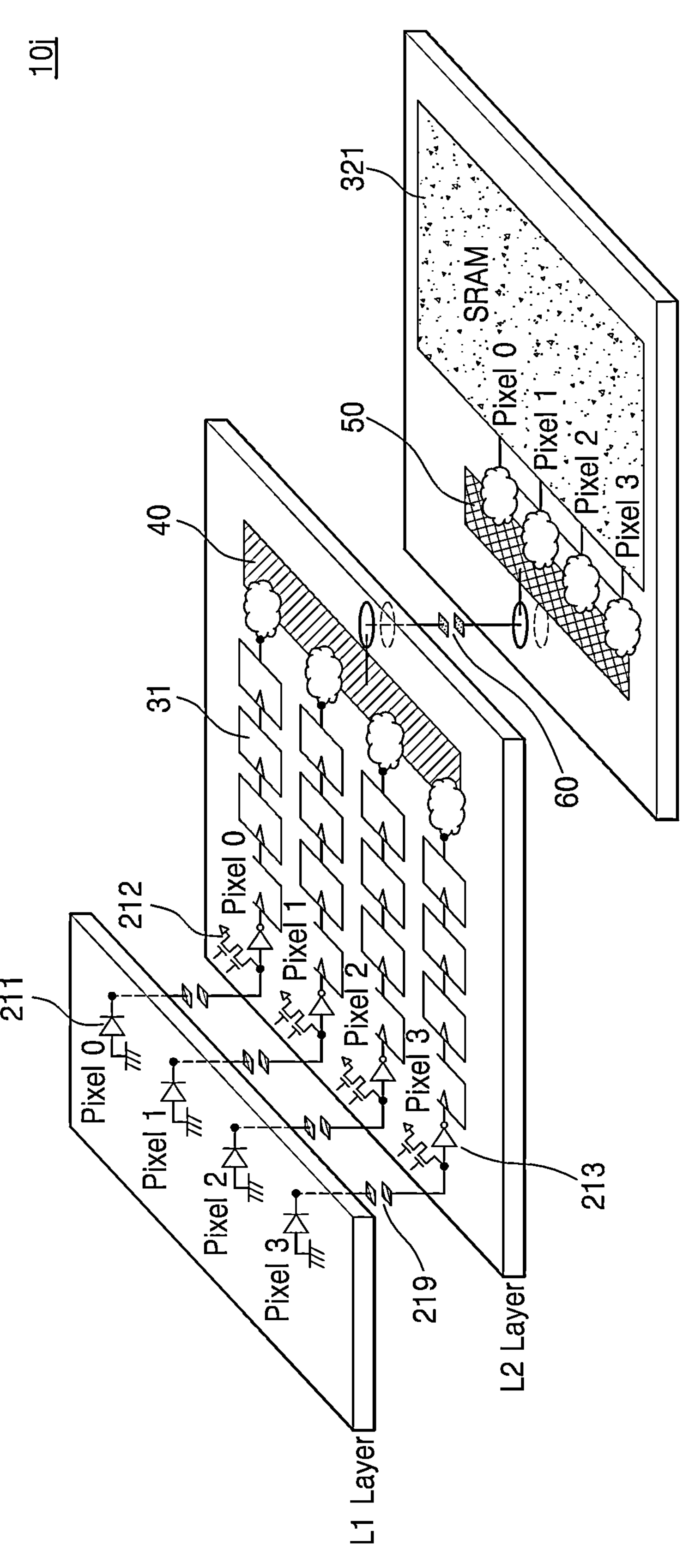
FIG. 17 is a schematic configuration diagram showing a circuit of each layer and interlayer connections of a solid-state imaging device in an embodiment.
Figure 18:
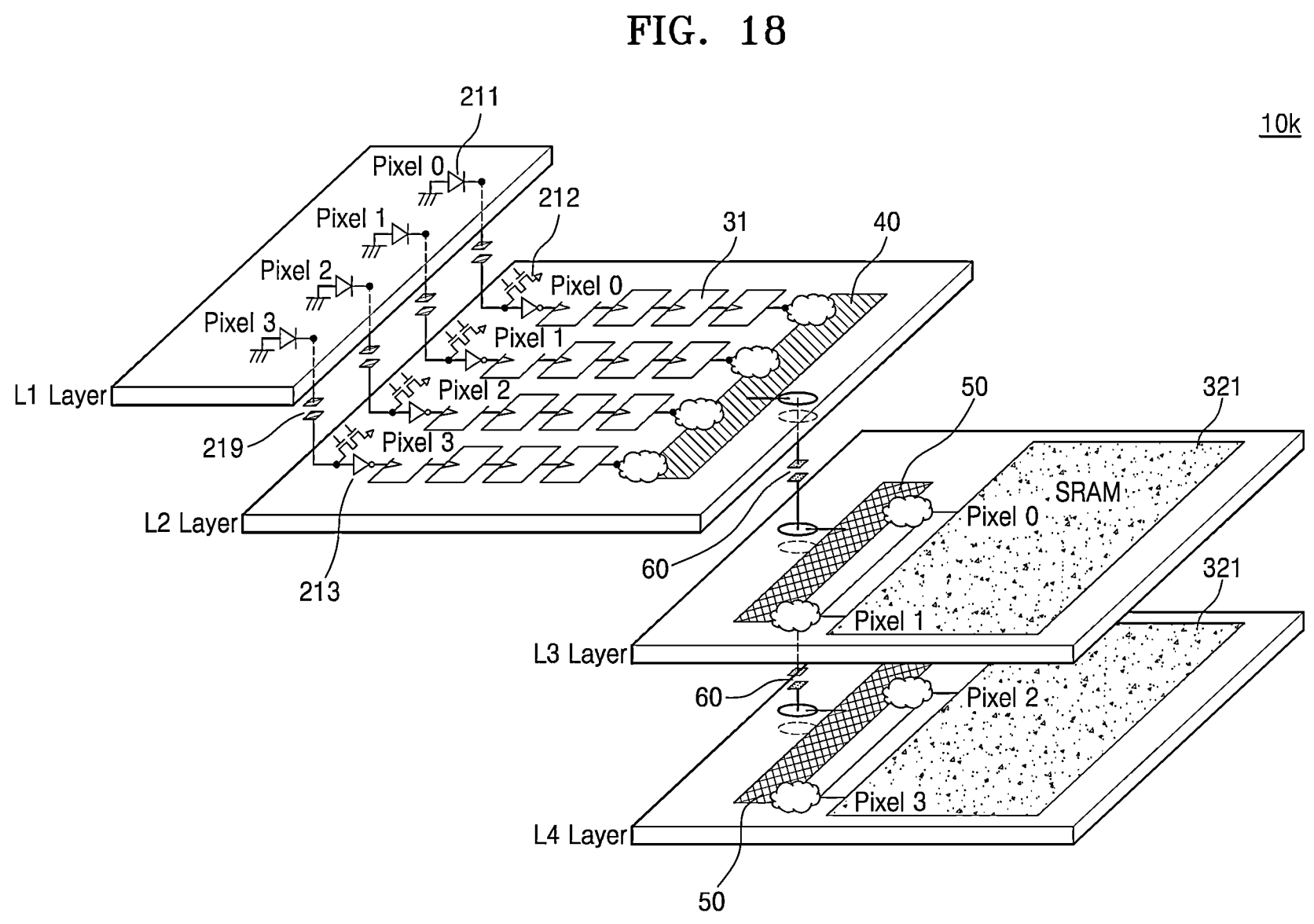

FIG. 17 is schematic configuration diagram showing the circuits and interlayer connections of each layer of a solid-state imaging device 10*j* according to another embodiment. FIG. 18 is schematic configuration diagram showing the circuits and interlayer connections of each layer of a solid-state imaging device 10*k* according to another embodiment.

According to one or more embodiments illustrated in FIGS. 1 to 16*a* flip-flop was used as a counter circuit was used as an example. However, the disclosure is not limited thereto, and as such, according to another embodiment, a static random-access memory (SRAM) memory circuit instead of a flip-flop as an upper bit group counter 321 at the rear. FIGS. 17 and 18 show that the counter value for one pixel unit is stored, and in reality, one SRAM may remember the upper bits of hundreds to tens of thousands of pixels (for example, pixel 0 to pixel 16383 corresponding to a pixel of 128×128 width and height). The layers of SRAM may be arranged in multiple layers as shown in FIG. 18. In the solid-state imaging devices 10*j* and 10*k*, as in other embodiments, the transmission of counter signals between layers is switched by a time division switching operation by the integrated circuit 40 and the distribution circuit 50 through a through electrode 60. By using SRAM, the area per bit may be reduced and the level of integration may be increased. Additionally, as another example, instead of SRAM, at least one of other latch circuits, dynamic random-access memory (DRAM), and synchronous DRAM (SDRAM) may be used as the upper bit group.

According to an embodiment, a first integrated circuit is provided between the lower bit group and the upper bit group, and the first integrated circuit connects the lower bit group and the upper bit group of the plurality of pixels to each other. Thereby, wiring circuits may be integrated in the solid-state imaging device, and higher integration may be achieved.

In the solid-state imaging device according to an embodiment, the photoelectric converter may be of the SPAD type. Thereby, a more highly sensitive solid-state imaging device may be provided.

In the solid-state imaging device according to an embodiment, the lower bit group is formed in one layer, and the upper bit group is formed in a layer different from the layer in which the lower bit group is formed. Thereby, the area of one pixel may be reduced, and a higher resolution solid-state imaging device may be provided.

The first integrated circuit may perform a time division switching operation and transmit a counter signal from the lower bit group to the upper bit group by temporally switching and connecting the corresponding lower bit group and upper bit group of the same counter. Thereby, wiring circuits may be integrated in the solid-state imaging device, and higher integration may be achieved.

In the solid-state imaging device according to an embodiment, the interlayer connection electrodes are provided between the first layer in which the lower bit group is formed and the second layer in which the upper bit group is formed, and the lower bit group is connected to the upper bit group through the first integrated circuit and the interlayer connection electrode. Thereby, because the interlayer connection electrode (through electrode 60) may be shared by a plurality of pixels, the number of the interlayer connection electrodes may be reduced, and further, the area of one pixel may be reduced.

In the solid-state imaging device according to an embodiment, the upper bit group corresponding to each of the plurality of pixels belonging to the pixel unit may be formed in two or more different second layers (e.g., L3 and L4 layers), and the interlayer connection electrodes in the first layer (e.g., L2 layer) of the lower bit group and the plurality of second layers may be arranged so that the XY coordinate positions in the plane direction of the layers correspond. According to an embodiment, arranged to correspond may mean that the arrangement of the interlayer connection electrodes in the first layer (e.g., L2 layer) of the lower bit group and the plurality of second layers is formed at a position where the XY coordinate positions in the plane direction of the layers substantially correspond. By doing this, in L2 to L3 layer, when manufacturing solid-state imaging devices, the mask may be made common or a mask with a small change scale may be used. Thereby, it is possible to reduce costs and shorten the manufacturing preparation period.

In the solid-state imaging device according to an embodiment, the upper bit group corresponding to each of the plurality of pixels belonging to the pixel unit may be formed in two or more different second layers, and the layer structures of the different second layers may correspond to each other. Corresponding to each other may mean that two or more different layer structures in which corresponding upper bit groups are arranged are formed substantially identically. Thereby, because a common mask may be used when manufacturing a solid-state imaging device, it is possible to reduce costs and shorten the manufacturing preparation period.

In the solid-state imaging device according to an embodiment, a distribution circuit is provided in the second layer and distributes the counter signal received from the interlayer connection electrode to the corresponding upper bit group. Thereby, wiring circuits may be integrated in the solid-state imaging device, and higher integration may be achieved.

In the solid-state imaging device according to an embodiment, a plurality of upper bit groups respectively corresponding to the plurality of pixels belonging to the pixel unit are formed in one second layer for each pixel, a distribution circuit is provided in the second layer, and the distribution circuit distributes the counter signal from the lower bit group sent from the first integrated circuit to the corresponding upper bit group. Thereby, wiring circuits may be integrated in the solid-state imaging device, and higher integration may be achieved.

In the solid-state imaging device according to an embodiment, the photoelectric converter, the lower bit group, and the upper bit group are each formed in different layers, and the interlayer between the layer of the photoelectric converter and the layer of the lower bit group and the interlayer between the layer of the lower bit group and the layer of the upper bit group are each connected via interlayer connection electrodes. Thereby, the interlayer connection electrode (through electrode 60) may be shared by a plurality of pixels, so the number of electrodes for interlayer connection may be reduced, and further, the area of one pixel may be reduced.

The solid-state imaging device according to an embodiment sends an event signal related to a specific event occurring in the upper bit group from the second layer to the first layer through the interlayer connection electrode. Thereby, processing according to the event may be performed after the event occurs. In an example case in which the event is an event signal of counter carryover, power consumption during image capturing in the circuit may be reduced by performing processing to stop light reception by the photodiode.

In the solid-state imaging device according to an embodiment, the solid-state imaging device may switch between normal mode and binning mode, and in the binning mode, the first integrated circuit adds or averages the counter signals of the lower bit groups of the plurality of pixels connected to the first integrated circuit and sends the added or averaged counter signal to at least one upper bit group. Thereby, the binning mode may be executed and high-sensitivity image capturing may be performed. For example, image capturing may be possible even in dark environments.

In the solid-state imaging device according to the embodiment, the solid-state imaging device is provided with a second integrated circuit that shares and integrates the optical signal output of the photoelectric converter of the plurality of pixels. In addition, the solid-state imaging device may switch between a normal mode in which a counter signal for each pixel is output and a binning mode in which the counter signals of multiple pixels are added or averaged and output, and in the binning mode, the second integrated circuit adds or averages the optical signal outputs of the photoelectric converter of the plurality of pixels and sends a counter signal based on the added or averaged optical signal output to at least one lower bit group. By doing this, the binning mode may also be executed and high-sensitivity image capturing may be performed. For example, image capturing may be performed even in dark environments.

The configuration of the solid-state imaging device 10 and the like described above is an explanation of the main configuration in explaining the features of the above-described embodiment, is not limited to the above-described configuration, and various variations may be made within the scope of the claims. In addition, this does not exclude the configuration of a general solid-state imaging device 10 or the like. For example, the number of pixels belonging to one pixel unit, the distribution number of pixels, the pixel layer distribution method, the number of stacks, and the number of divisions of counter bits (in particular, the number of divisions of the upper bit group and the number of arrangement stacks) are not limited to the content of the present embodiment.

While an embodiment has been particularly shown and described with reference to embodiments thereof, it will be understood that various changes in form and details may be made therein without departing from the spirit and scope of the following claims.

What is claimed is:

1. A solid-state imaging device comprising:

a plurality of pixels, each of the plurality of pixels comprising:

a photoelectric converter; and a counter configured to count a pulse signal output based on an amount of light incident on the photoelectric converter, the counter comprising a first bit group counter among a plurality of first bit group counters and a second bit group counter among a plurality of second bit group counters; and a first integrated circuit provided between the plurality of first bit group counters and the plurality of second bit group counters, and configured to connect each of the plurality of first bit group counters to a respective second bit group counter among the plurality of second bit group counters for each of the plurality of pixels in a time division manner.

2. The solid-state imaging device of claim 1, wherein the photoelectric converter comprises a single-photon avalanche diode (SPAD).

3. The solid-state imaging device of claim 1, further comprising:

a first layer and a second layer in a stacked structure, wherein the plurality of first bit group counters are is provided in the first layer, and the plurality of second bit group counters provided in the second layer.

4. The solid-state imaging device of claim 1, wherein the counter of a first pixel among the plurality of pixels comprises a first first bit group counter and a first second bit group counter, and wherein the first integrated circuit is further configured to:

perform a switching operation to connect the first first bit group counter and the first second bit group counter to each other in the time division manner, and transmit a counter signal from the first first bit group counter to the first second bit group counter.

5. The solid-state imaging device of claim 4, further comprising:

a first layer and one or more second layers in a stacked structure; and an interlayer connection electrode provided between the first layer and the one or more second layers, wherein the first first bit group counter is formed in the first layer, and the first second bit group counter is formed in the one or more second layers different from the first layer, and wherein the first first bit group counter is connected to the first second bit group counter through the first integrated circuit and the interlayer connection electrode.

6. The solid-state imaging device of claim 5, further comprising:

a pixel unit comprised of a plurality of pixels sharing the first integrated circuit, wherein the plurality of second bit group counters corresponding to each of the plurality of pixels included in the pixel unit is formed in two or more different layers, and wherein the interlayer connection electrode in a layer in which the plurality of first bit group counters are formed and the two or more different layers in which the plurality of second bit group counters are is formed is arranged spatially corresponding to each other.

7. The solid-state imaging device of claim 6, wherein two or more different layer structures in which the plurality of second bit group counters are arranged are formed to correspond to each other.

8. The solid-state imaging device of claim 6, further comprising:

a distribution circuit formed in each layer in which the plurality of second bit group counters are formed, wherein the distribution circuit is configured to distribute the counter signal from the first first bit group counter through the interlayer connection electrode to the corresponding first second bit group counter.

9. The solid-state imaging device of claim 8, wherein the plurality of second bit group counters respectively corresponding to the plurality of pixels included in the pixel unit are formed in a first second layer, among the one or more second layers for each pixel, and the distribution circuit is provided in the first second layer, and wherein the distribution circuit is configured to distribute the counter signal from the first first bit group counter sent from the first integrated circuit to the corresponding first second bit group counter.

10. The solid-state imaging device of claim 1, wherein, in each of the plurality of pixels, the photoelectric converter, the first bit group counter, and the second bit group counter are each formed in different layers, and an interlayer between a layer of the photoelectric converter and a layer of the first bit group counter and an interlayer between the layer of the first bit group counter and a layer of the second bit group counter are each connected to each other through interlayer connection electrodes.

11. The solid-state imaging device of claim 5, wherein an event signal related to a specific event occurring in the first second bit group counter is configured to be sent, through the interlayer connection electrode, from a layer in which the first second bit group counter is formed to a layer in which the first first bit group counter is formed.

12. The solid-state imaging device of claim 1, wherein the solid-state imaging device is configured to switch between a normal mode that outputs a counter signal for each pixel and a binning mode that outputs counter signals of the plurality of pixels by adding or averaging the counter signals of the plurality of pixels, and in the binning mode, the first integrated circuit is configured to add or average counter signals of the plurality of first bit group counters of a plurality of pixels connected to the first integrated circuit, and transmit the added or averaged counter signal to at least one of the plurality of second bit group counters.

13. The solid-state imaging device of claim 1, further comprising a second integrated circuit configured to share and integrate an optical signal output of the photoelectric converter of the plurality of pixels.

14. The solid-state imaging device of claim 13, wherein the solid-state imaging device is configured to switch between a normal mode that outputs a counter signal for each pixel and a binning mode that outputs counter signals of the plurality of pixels by adding or averaging the counter signals of the plurality of pixels, and in the binning mode, the second integrated circuit is configured to add or average optical signal outputs of the photoelectric converters of the plurality of pixels and send a counter signal based on the added or averaged optical signal outputs, to at least one of the plurality of first bit group counters.

15. The solid-state imaging device of claim 1, wherein the counter comprises a ripple counter.

16. The solid-state imaging device of claim 1, wherein at least one of the plurality of first bit group counters comprises a ripple counter, and at least one of the plurality of second bit group counters comprises at least one of a static random-access memory (SRAM), a dynamic random-access memory (DRAM), a latch, and a synchronous DRAM (SDRAM).

17. A solid-state imaging device configured by stacking a plurality of layers, the solid-state imaging device comprising:

a plurality of pixels, each of the plurality of pixels comprising:

a photoelectric converter; and a signal processing unit comprising:

a counter configured to count a pulse signal output based on an amount of light incident on the photoelectric converter, the counter comprising a first bit group counter and a second bit group counter formed in different layers among the plurality of layers.

18. The solid-state imaging device of claim 17, wherein the first bit group counter is formed in a first layer among the plurality of layers, the second bit group counter is formed in a second layer among the plurality of layers, and the second layer comprises one or more layers.

19. The solid-state imaging device of claim 17, wherein the first bit group counter and the second bit group counter are configured to be connected to each other through an interlayer connection portion, wherein the interlayer connection portion comprises:

an integrated circuit formed on a same layer as the first bit group counter;

a distribution circuit formed on a same layer as the second bit group counter; and a through electrode vertically connecting the integrated circuit to the distribution circuit.

20. A solid-state imaging device including a pixel unit including a plurality of vertically and horizontally adjacent pixels, the solid-state imaging device comprising:

a counter configured to count pulse signals output based on an amount of light incident on each of the plurality of pixels, the counter comprising a first bit group counter and a second bit group counter, wherein the second bit group counter corresponding to the plurality of pixels is arranged in at least two layers, and wherein the first bit group counter corresponding to the plurality of pixels included in the pixel unit is arranged as one layer different from the at least two layers in which the second bit group counter is arranged.

* * * * *